US012439802B2

(12) United States Patent
Park et al.

(10) Patent No.: US 12,439,802 B2
(45) Date of Patent: Oct. 7, 2025

(54) DISPLAY PANEL WITH INSULATING LINE AND CONNECTING LINE EXTENDING FROM AUXILIARY PIXEL CIRCUIT TO AUXILIARY DISPLAY ELEMENT AND DISPLAY APPARATUS INCLUDING THE SAME

(71) Applicant: Samsung Display Co., Ltd., Yongin-si (KR)

(72) Inventors: Gwuihyun Park, Yongin-si (KR); Kwangwoo Park, Yongin-si (KR); Koichi Sugitani, Yongin-si (KR); Chulwon Park, Yongin-si (KR); Saehee Han, Yongin-si (KR); Pilsoon Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 988 days.

(21) Appl. No.: 17/513,835

(22) Filed: Oct. 28, 2021

(65) Prior Publication Data

US 2022/0208866 A1 Jun. 30, 2022

(30) Foreign Application Priority Data

Dec. 29, 2020 (KR) ........................ 10-2020-0186770

(51) Int. Cl.
*H10K 59/65* (2023.01)
*H10K 59/121* (2023.01)
(Continued)

(52) U.S. Cl.
CPC ........... *H10K 59/65* (2023.02); *H10K 59/121* (2023.02); *H10K 59/124* (2023.02);
(Continued)

(58) Field of Classification Search
CPC .... H10K 59/121; H10K 59/65; H10K 59/124; H10K 59/1315; H10K 59/1201; H10K 71/00
See application file for complete search history.

(56) References Cited

U.S. PATENT DOCUMENTS 9,099,674 B2 8/2015 Ha et al.
2014/0084283 A1* 3/2014 Lim .................... H10D 62/402 257/43

(Continued)

FOREIGN PATENT DOCUMENTS

CN 111063719 4/2020
KR 10-2019-0030798 3/2019

(Continued)

OTHER PUBLICATIONS

Notice of Allowance dated Dec. 16, 2024, in Korean Patent Application No. 10-2020-0186770.

*Primary Examiner* — Lex H Malsawma
(74) *Attorney, Agent, or Firm* — Innovation Counsel LLP

(57) ABSTRACT

A display panel includes a substrate including a main display area, a component area, and a peripheral area, an auxiliary display element in the component area, an auxiliary pixel circuit in the peripheral area, the auxiliary pixel circuit including an auxiliary thin film transistor and an auxiliary storage capacitor, a connecting line connecting the auxiliary display element to the auxiliary pixel circuit, the connecting line having at least a part in the component area, an insulating line overlapping the connecting line in the component area, and a first organic insulating layer and a second organic insulating layer stacked between the substrate and the auxiliary display element in the component area, wherein the connecting line and the insulating line are between the first organic insulating layer and the second organic insulating layer.

29 Claims, 28 Drawing Sheets

(51) Int. Cl.

| | |
|---|---|
| ***H10K 59/124*** | (2023.01) |
| ***H10K 59/131*** | (2023.01) |
| ***H10K 71/00*** | (2023.01) |
| *H10K 59/12* | (2023.01) |

(52) U.S. Cl.
CPC ....... *H10K 59/131* (2023.02); *H10K 59/1315* (2023.02); *H10K 71/00* (2023.02); *H10K 59/1201* (2023.02)

(56) References Cited

U.S. PATENT DOCUMENTS

| | | | | |
|---|---|---|---|---|
| 2019/0081118 | A1 | 3/2019 | Oh et al. | |
| 2019/0252475 | A1 | 8/2019 | Sung et al. | |
| 2020/0185643 | A1 | 6/2020 | Moon et al. | |
| 2020/0258967 | A1* | 8/2020 | Kim | H01L 27/1218 |
| 2020/0357871 | A1 | 11/2020 | Chung et al. | |
| 2020/0395434 | A1* | 12/2020 | Jeon | H10K 71/00 |
| 2021/0066427 | A1* | 3/2021 | Ma | H01L 27/156 |
| 2021/0391407 | A1* | 12/2021 | Yoon | G06F 3/0412 |
| 2022/0059633 | A1* | 2/2022 | Kang | H10K 59/123 |

FOREIGN PATENT DOCUMENTS

| | | |
|---|---|---|
| KR | 10-2019-0098703 | 8/2019 |
| KR | 10-2020-0039866 | 4/2020 |
| KR | 10-2020-0069421 | 6/2020 |
| KR | 10-2020-0143623 | 12/2020 |

* cited by examiner

DISPLAY PANEL WITH INSULATING LINE AND CONNECTING LINE EXTENDING FROM AUXILIARY PIXEL CIRCUIT TO AUXILIARY DISPLAY ELEMENT AND DISPLAY APPARATUS INCLUDING THE SAME

CROSS-REFERENCE TO RELATED APPLICATION

This application claims priority from and the benefit of Korean Patent Application No. 10-2020-0186770, filed on Dec. 29, 2020, which is hereby incorporated by reference for all purposes as if fully set forth herein.

BACKGROUND

Field

Embodiments of the invention relate generally to a display panel and a display apparatus including the display panel, and more particularly, to a display panel having an expanded display area so as to display images in a region where a component, that is, an electronic element, is provided, and a display apparatus including the display panel.

Discussion of the Background

Display apparatuses have been used for various purposes. In addition, because the thickness and weight of display apparatuses have been reduced, the range of utilization of display apparatuses has increased.

According to the use of display apparatuses, different methods of designing shapes thereof have been developed and more functions have been embedded in or linked to the display apparatuses.

The above information disclosed in this Background section is only for understanding of the background of the inventive concepts, and, therefore, it may contain information that does not constitute prior art.

SUMMARY

One or more embodiments include a display panel having an expanded display area so as to display images on a region where a component, that is, an electronic element, is provided, and a display apparatus including the display panel. However, the above technical features are exemplary, and the scope of the disclosure is not limited thereto.

Additional features of the inventive concepts will be set forth in the description which follows, and in part will be apparent from the description, or may be learned by practice of the inventive concepts.

According to an embodiment, a display panel includes a substrate including a main display area, a component area, and a peripheral area, an auxiliary display element in the component area, an auxiliary pixel circuit in the peripheral area, the auxiliary pixel circuit including an auxiliary thin film transistor and an auxiliary storage capacitor, a connecting line connecting the auxiliary display element to the auxiliary pixel circuit, the connecting line having at least a part in the component area, an insulating line overlapping the connecting line in the component area, and a first organic insulating layer and a second organic insulating layer stacked between the substrate and the auxiliary display element in the component area, wherein the connecting line and the insulating line are between the first organic insulating layer and the second organic insulating layer.

A refractive index of the insulating line may have a value between a refractive index of the first organic insulating layer and a refractive index of the connecting line.

The insulating line may be under the connecting line.

A thickness of the insulating line may be greater than a thickness of the connecting line.

A width of an upper surface of the insulating line may be different from a width of a lower surface of the connecting line.

The insulating line may be on the connecting line.

A thickness of the insulating line may be greater than a thickness of the connecting line.

The insulating line may include a first insulating line and a second insulating line, and the first insulating line may be under the connecting line and the second insulating line may be on the connecting line.

A refractive index of the first insulating line may have a value between a refractive index of the first organic insulating layer and a refractive index of the connecting line, and a refractive index of the second insulating line may have a value between a refractive index of the second organic insulating layer and the refractive index of the connecting line.

A thickness of the first insulating line and a thickness of the second insulating line may be less than a thickness of the connecting line.

A thickness of the first insulating line and a thickness of the second insulating line may be greater than a thickness of the connecting line.

The first organic insulating layer may include photosensitive polyimide and the second organic insulating layer may include a siloxane-based resin.

The display panel may further include a metal connecting line connecting the connecting line to the auxiliary display element, wherein the metal connecting line may be at a same layer as the connecting line and an end of the connecting line may be in direct contact with the metal connecting line.

The display panel may further include an inorganic insulating layer on the substrate, wherein the inorganic insulating layer may include a hole or a groove corresponding to the component area.

The first organic insulating layer may fill the hole or the groove of the inorganic insulating layer and may be on a front surface of the substrate.

The display panel may further include a buffer layer between the substrate and the auxiliary thin film transistor, wherein the buffer layer may include an opening corresponding to the component area.

The display panel may further include an anti-reflection layer on a lower surface of the substrate.

According to another embodiment, a display apparatus includes a display panel including a main display area including main sub-pixels, a component area including auxiliary sub-pixels, and a peripheral area, and a component under the display panel to correspond to the component area, wherein the display panel includes a substrate, an auxiliary display element in the component area, an auxiliary pixel circuit in the peripheral area, the auxiliary pixel circuit is including an auxiliary thin film transistor and an auxiliary storage capacitor, a connecting line connecting the auxiliary display element to the auxiliary pixel circuit, the connecting line having at least a part in the component area, an insulating line overlapping the connecting line in the component area, and a first organic insulating layer and a second organic insulating layer stacked between the substrate and the auxiliary display element in the component area, wherein the connecting line and the insulating line are between the first organic insulating layer and the second organic insulating layer.

A refractive index of the insulating line may have a value between a refractive index of the first organic insulating layer and a refractive index of the connecting line.

The insulating line may include a first insulating line and a second insulating line, and the first insulating line may be under the connecting line and the second insulating line may be on the connecting line.

A refractive index of the first insulating line may have a value between a refractive index of the first organic insulating layer and a refractive index of the connecting line, and a refractive index of the second insulating line may have a value between a refractive index of the second organic insulating layer and the refractive index of the connecting line.

The first organic insulating layer may include photosensitive polyimide and the second organic insulating layer may include a siloxane-based resin.

The display apparatus may further include an inorganic insulating layer on the substrate, wherein the inorganic insulating layer may include a hole or a groove corresponding to the component area.

The first organic insulating layer may fill the hole or the groove of the inorganic insulating layer and may be on a front surface of the substrate.

The component may include an imaging device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
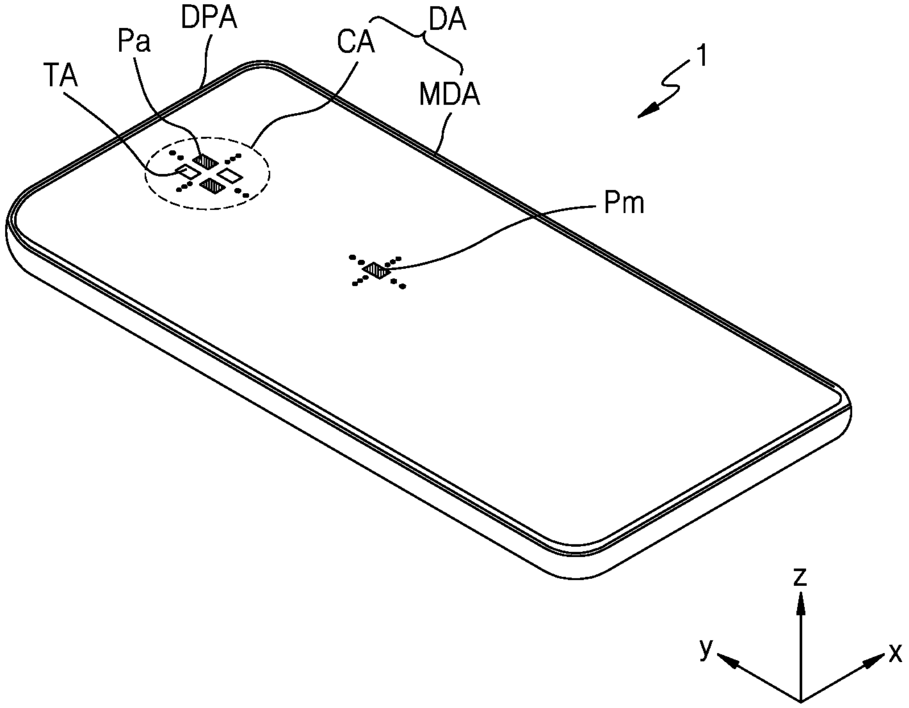
FIG. 1 is a perspective view illustrating a display apparatus according to an embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are illustrated in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view illustrating a display apparatus 1 according to an embodiment.

Referring to FIG. 1, the display apparatus 1 includes a display area DA and a peripheral area DPA on an outer portion of the display area DA. The display area DA may include a component area CA and a main display area MDA at least partially surrounding the component area CA. That is, the component area CA and the main display area MDA may separately or together display an image. The peripheral area DPA may be a non-display area on which pixels are not arranged. The display area DA may be entirely surrounded by the peripheral area DPA.

In FIG. 1, one component area CA is in the main display area MDA. In another embodiment, the display apparatus 1 may include two or more component areas CA, and shapes and sizes of the plurality of component areas CA may be different from one another. In a direction perpendicular to an upper surface of the display apparatus 1, the component area CA may have various shapes, e.g., a circular shape, an elliptical shape, a polygonal shape such as a square shape, a star shape, a diamond shape, etc. In addition, in FIG. 1, the component area CA is on an upper center (in a +y direction) of the main display area MDA that has a rectangular shape in a direction perpendicular to the upper surface of the display apparatus 1, but the component area CA may be at a side, e.g., an upper right side or an upper left side, of the main display area MDA having a rectangular shape.

The display apparatus 1 may provide images by using a plurality of main sub-pixels Pm in the main display area MDA and a plurality of auxiliary sub-pixels Pa in the component area CA.

As described later with reference to FIG. 2, a component 40, that is, an electronic element, may be under the display panel to correspond to the component area CA. The component 40 may include a camera using an infrared ray or a visible ray, and may include an imaging device. Alternatively, the component 40 may include a solar battery, a flash, an illuminance sensor, a proximity sensor, or an iris sensor. Alternatively, the component 40 may have a function of receiving sound. In order to reduce a restriction in functions of the component 40, the component area CA may include a transmission area TA through which light and/or sound output from the component 40 to the outside or proceeding from the outside toward the component 40 may pass. In the display panel or the display apparatus including the display panel according to an embodiment, when the light passes through the component area CA, a light transmittance may be about 10% or greater, for example, 40% or greater, 25% or greater, 50% or greater, 85% or greater, or 90% or greater.

The plurality of auxiliary sub-pixels Pa may be in the component area CA. The plurality of auxiliary sub-pixels Pa emit light to provide a certain image. An image displayed on the component area CA is an auxiliary image, and may have a lower resolution than that of the image displayed on the main display area MDA. That is, the component area CA may include the transmission area TA through which the light and sound may transmit, and when there is no sub-pixel in the transmission area TA, the number of auxiliary sub-pixels Pa per unit area may be less than the number of main sub-pixels Pm per unit area in the main display area MDA.

FIGS. 2A to 2D are cross-sectional views partially illustrating the display apparatus 1 according to one or more embodiments.

Figure 2A:
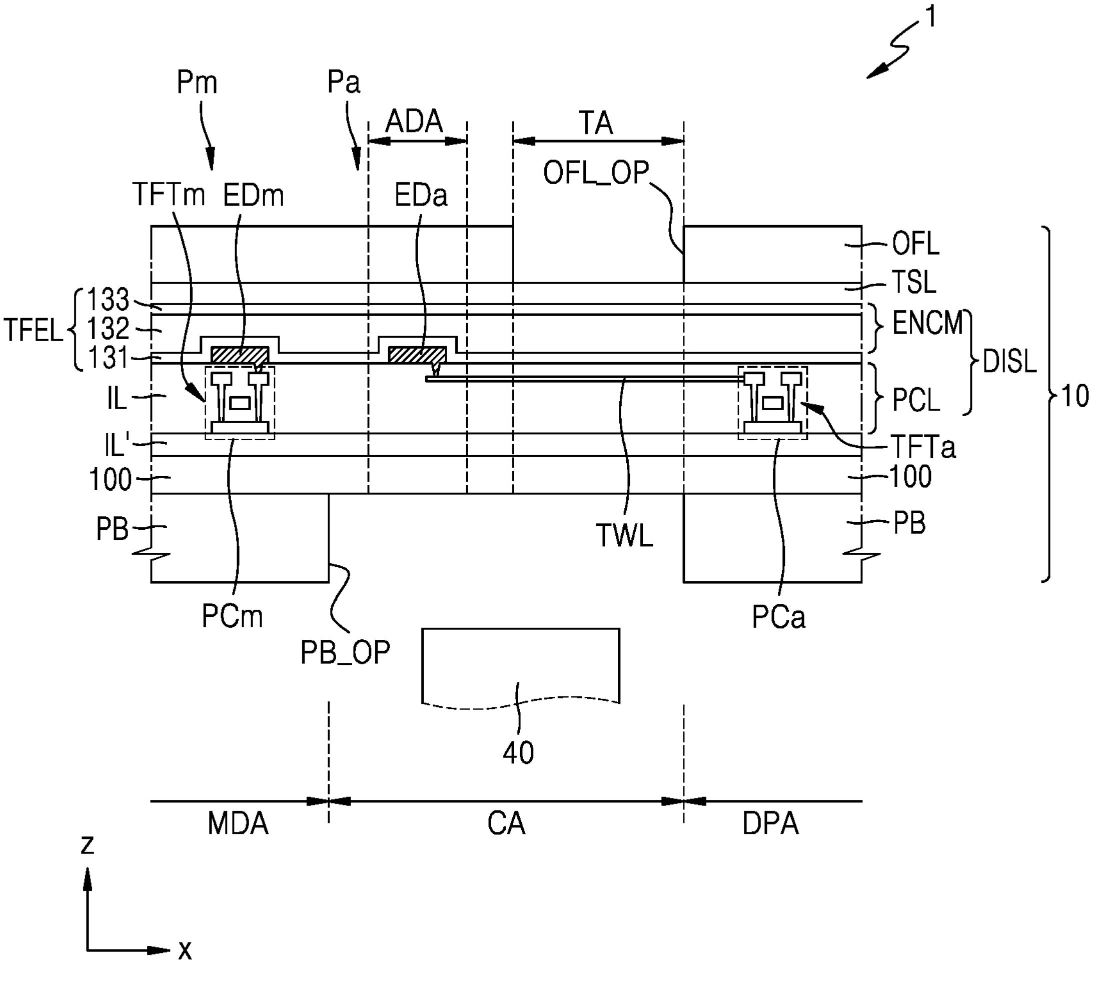
FIG. 2A is a cross-sectional view partially illustrating a display apparatus according to an embodiment.

Referring to FIG. 2A, the display apparatus 1 may include a display panel 10 and the component 40 overlapping the display panel 10. A cover window (not illustrated) configured to protect the display panel 10 may be further above the display panel 10.

The display panel 10 includes the component area CA that is a region overlapping the component 40 and the main display area MDA displaying main images. The display panel 10 may include a substrate 100, a display layer DISL on the substrate 100, a touch screen layer TSL, an optical functional layer OFL, and a panel protective member PB under the substrate 100.

The display layer DISL may include a circuit layer PCL including thin film transistors TFTm and TFTa, a display element layer including light-emitting elements EDm and EDa that are display elements, and an encapsulation member ENCM such as a thin film encapsulation layer TFEL or a sealing substrate (not illustrated). Insulating layers IL and IL' may be between the substrate 100 and the display layer DISL, and in the display layer DISL.

The substrate 100 may include an insulating material, such as glass, quartz, and polymer resin. The substrate 100 may include a rigid substrate or a flexible substrate that may be bendable, foldable, and rollable.

A main pixel circuit PCm and a main light-emitting element EDm connected to the main pixel circuit PCm may be in the main display area MDA of the display panel 10. The main pixel circuit PCm includes at least one thin film transistor TFTm and may control light emission from the main light-emitting element EDm. The main sub-pixel Pm may be implemented by light emission of the main light-emitting element EDm.

The auxiliary light-emitting element EDa is in the component area CA of the display panel 10 to implement the auxiliary sub-pixel Pa. In the embodiment, the auxiliary pixel circuit PCa driving the auxiliary light-emitting element EDa may not be in the component area CA, but in the peripheral area DPA that is a non-display area. In another embodiment, the auxiliary pixel circuit PCa may be partially in the main display area MDA or may be between the main display area MDA and the component area CA. That is, the auxiliary pixel circuit PCa may be provided not to overlap the auxiliary light-emitting element EDa.

The auxiliary pixel circuit PCa may include at least one thin film transistor TFTa and may be electrically connected to the auxiliary light-emitting element EDa via a connecting line TWL. The connecting line TWL may include a transparent conductive material. The auxiliary pixel circuit PCa may control the light emission from the auxiliary light-emitting element EDa. The auxiliary sub-pixel Pa may be implemented by the light emission from the auxiliary light-emitting element EDa. In the component area CA, a region where the auxiliary light-emitting element EDa is provided may be referred to as an auxiliary display area ADA.

Also, in the component area CA, a region where the auxiliary light-emitting element EDa that is a display element is not provided may be referred to as a transmission area TA. The transmission area TA may be a region through which light/signal emitted from the component 40 or light/a signal incident in the component 40 that corresponds to the component area CA may transmit. The auxiliary display area ADA and the transmission area TA may be alternately arranged in the component area CA. The connecting line TWL connecting the auxiliary pixel circuit PCa to the auxiliary light-emitting element EDa may be in the transmission area TA. The connecting line TWL may include a transparent conductive material having a high transmittance, and thus, even when the connecting line TWL is in the transmission area TA, the transmittance of the transmission area TA may be secured.

In the embodiment, because the auxiliary pixel circuit PCa is not in the component area CA, an area of the transmission area TA may be ensured and the light transmittance may be further improved.

The main light-emitting device EDm and the auxiliary light-emitting device EDa that are the display elements may be covered by a thin film encapsulation layer TFEL or an encapsulation substrate. In one or more embodiments, the thin film encapsulation layer TFEL may include at least one inorganic encapsulation layer and at least one organic encapsulation layer as illustrated in FIG. 2. In an embodiment, the thin film encapsulation layer TFEL may include first and second inorganic encapsulation layers 131 and 132 and an organic encapsulation layer 132 between the first and second inorganic encapsulation layers 131 and 133.

The first and second inorganic encapsulation layers 131 and 133 may each include one or more inorganic insulating materials such as silicon oxide ($SiO_2$), silicon nitride (SiNx), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_2$), and may be formed by a chemical vapor deposition (CVD) method, etc. The organic encapsulation layer 132 may include a polymer-based material. The polymer-based material may include a silicon-based resin, an acryl-based resin, an epoxy-based resin, polyimide, polyethylene, etc.

The first inorganic encapsulation layer 131, the organic encapsulation layer 132, and the second inorganic encapsulation layer 133 may be integrally provided to cover the main display area MDA and the component area CA.

When the main light-emitting device EDm and the auxiliary light-emitting device EDa that are the display elements are encapsulated by the encapsulation substrate (not illustrated), the encapsulation substrate may face the substrate 100 with the display elements therebetween. There may be a gap between the encapsulation substrate and the display element. The encapsulation substrate may include glass. A sealant including frit, etc. may be between the substrate 100 and the encapsulation substrate, and the sealant may be in the peripheral area DPA. The sealant in the peripheral area DPA may surround the display area DA to prevent the moisture from infiltrating through the side surfaces of the display panel.

The touch screen layer TSL may obtain coordinate information according to an external input, e.g., a touch event. The touch screen layer TSL may include a touch electrode and touch lines connected to the touch electrode. The touch screen layer TSL may sense an external input according to a self-capacitance method or a mutual capacitance method.

The touch screen layer TSL may be on the thin film encapsulation layer TFEL. Alternatively, the touch screen layer TSL may be separately formed on a touch substrate, and then may be coupled onto the thin film encapsulation layer TFEL via an adhesive layer such as an optical clear adhesive (OCA). In an embodiment, the touch screen layer TSL may be directly on the thin film encapsulation layer TFEL, and in this case, the adhesive layer may not be provided between the touch screen layer TSL and the thin film encapsulation layer TFEL.

The optical functional layer OFL may include an anti-reflection layer. The anti-reflection layer may reduce a reflectivity of light (external light) incident into the display apparatus 1 from the outside.

In some embodiments, the optical functional layer OFL may include a polarization film. The optical functional layer OFL may include an opening OFL_OP corresponding to the transmission area TA. Accordingly, the light transmittance of the transmission area TA may be noticeably improved. A transparent material such as an optically clear resin (OCR) may be filled in the opening OFL_OP.

In some embodiments, the optical functional layer OFL may include a filter plate including a black matrix and color filters.

The panel protective member PB is attached to a lower portion of the substrate 100 in order to support and protect the substrate 100. The panel protective member PB may include an opening PB_OP corresponding to the component area CA. When the panel protective member PB includes the opening PB_OP, the light transmittance of the component area CA may be improved. The panel protective member PB may include polyethylene terephthalate (PET) or polyimide (PI).

An area of the component area CA may be greater than an area of a region in which the component 40 is arranged. Accordingly, an area of the opening PB_OP in the panel protective member PB may not be equal to that of the component area CA.

Also, a plurality of components 40 may be in the component area CA. The plurality of components 40 may have different functions from one another. For example, the plurality of components 40 may include at least two of a camera (imaging device), a solar battery, a flash, a proximity sensor, an illuminance sensor, and an iris sensor.

Figure 2B:
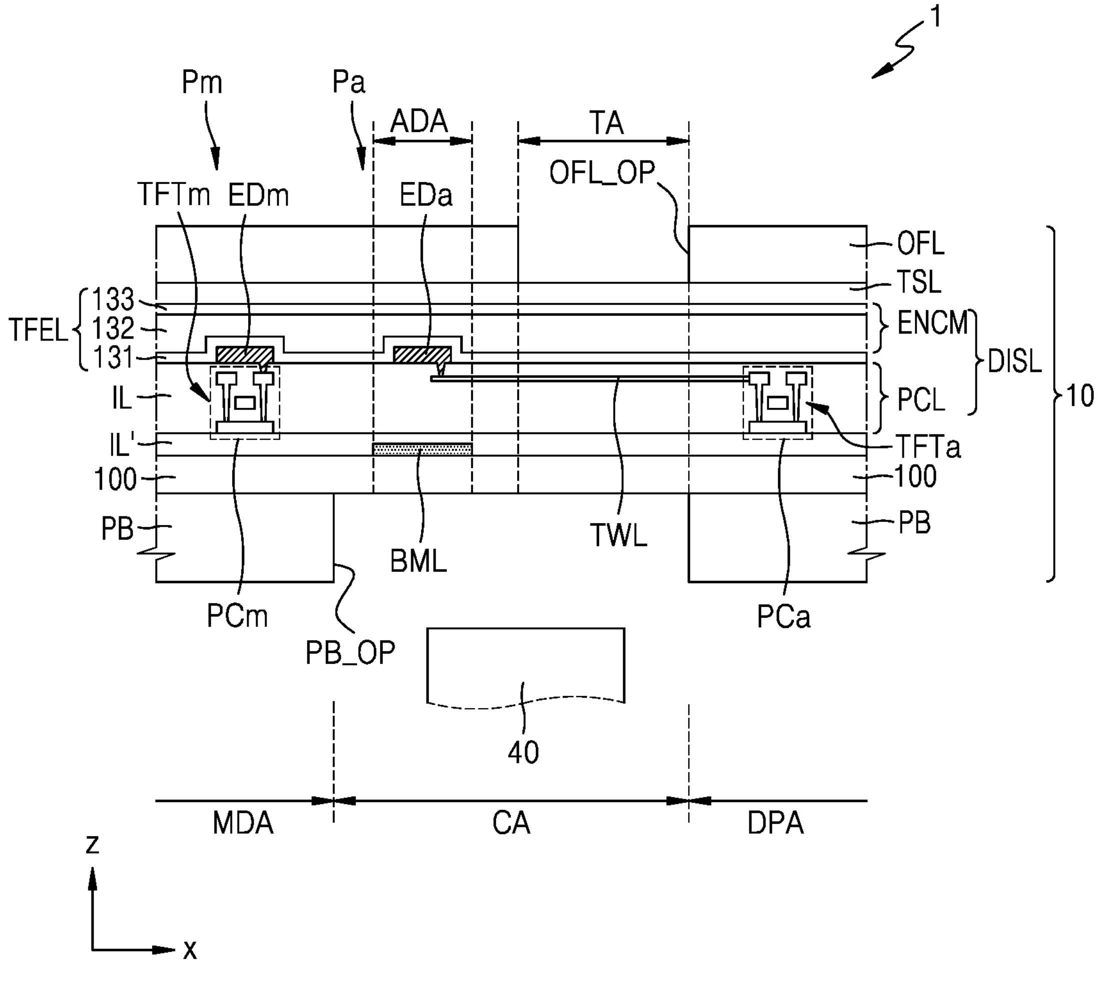
FIG. 2B is a cross-sectional view partially illustrating a display apparatus including a bottom metal layer according to an embodiment.

In FIG. 2A, there is not illustrated a bottom metal layer BML under the auxiliary light-emitting element EDa of the component area CA, but as illustrated in FIG. 2B, the display apparatus 1 according to the embodiment may include the bottom metal layer BML.

The bottom metal layer BML may be disposed between the substrate 100 and the auxiliary light-emitting element EDa to overlap the auxiliary light-emitting element EDa. The bottom metal layer BML may be disposed within the insulating layer IL' and in contact with an upper layer of the substrate 100. The bottom metal layer BML may block the external light from reaching the auxiliary light-emitting element EDa. In addition, the bottom metal layer BML may entirely correspond to the component area CA, and may include a lower hole corresponding to the transmission area TA. In this case, the lower hole may be provided in various shapes, e.g., a polygonal shape, a circular shape, or a non-defined shape, so as to adjust a refractive characteristic of the external light.

Figure 2C:
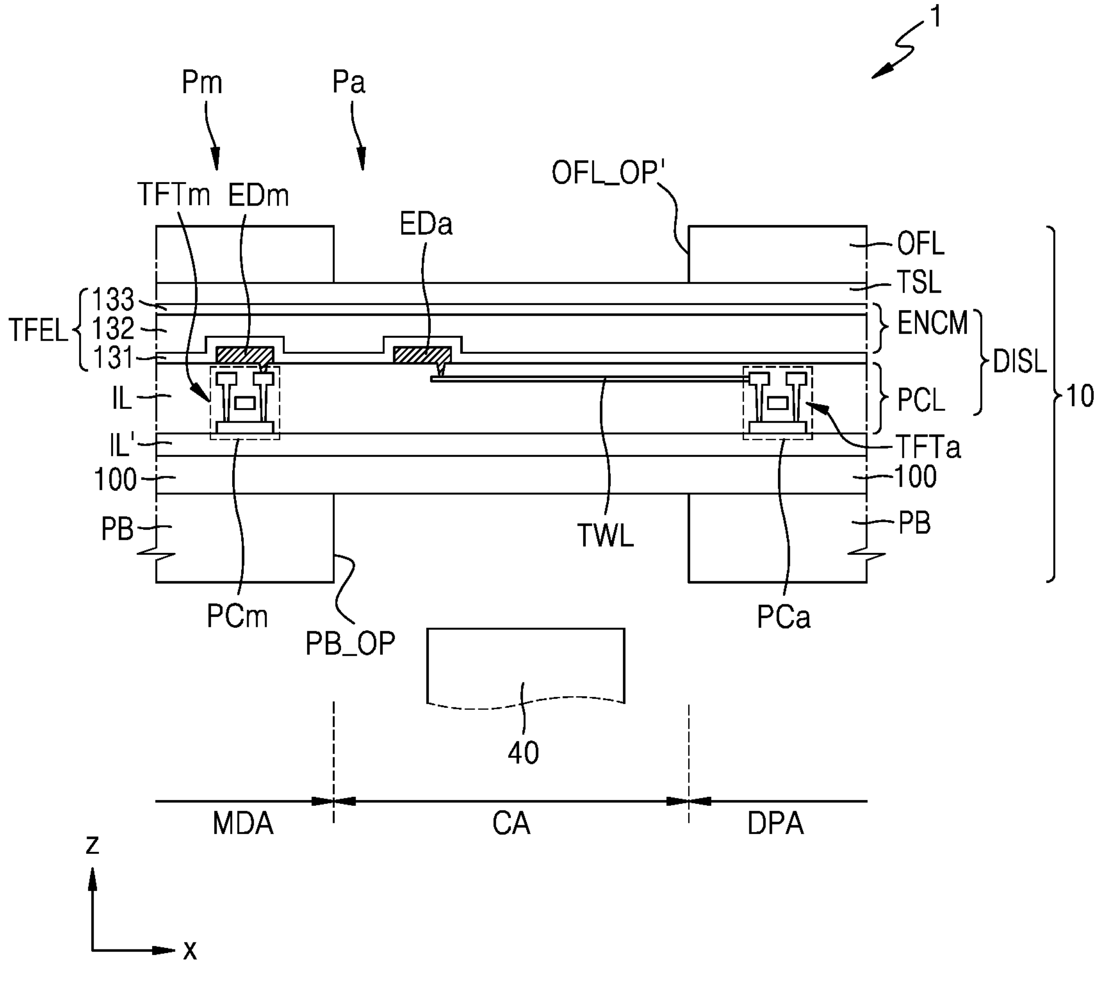
FIG. 2C is a cross-sectional view partially illustrating a display apparatus including an optical functional layer according to an embodiment.

Also, FIG. 2A illustrates that the optical functional layer OFL includes the opening OFL_OP corresponding to the transmission area TA, but as illustrated in FIG. 2C, the optical functional layer OFL may include an opening OFL_OP' corresponding to the component area CA. A transparent material such as an optically clear resin (OCR) may be filled in the opening OFL_OP'.

Figure 2D:
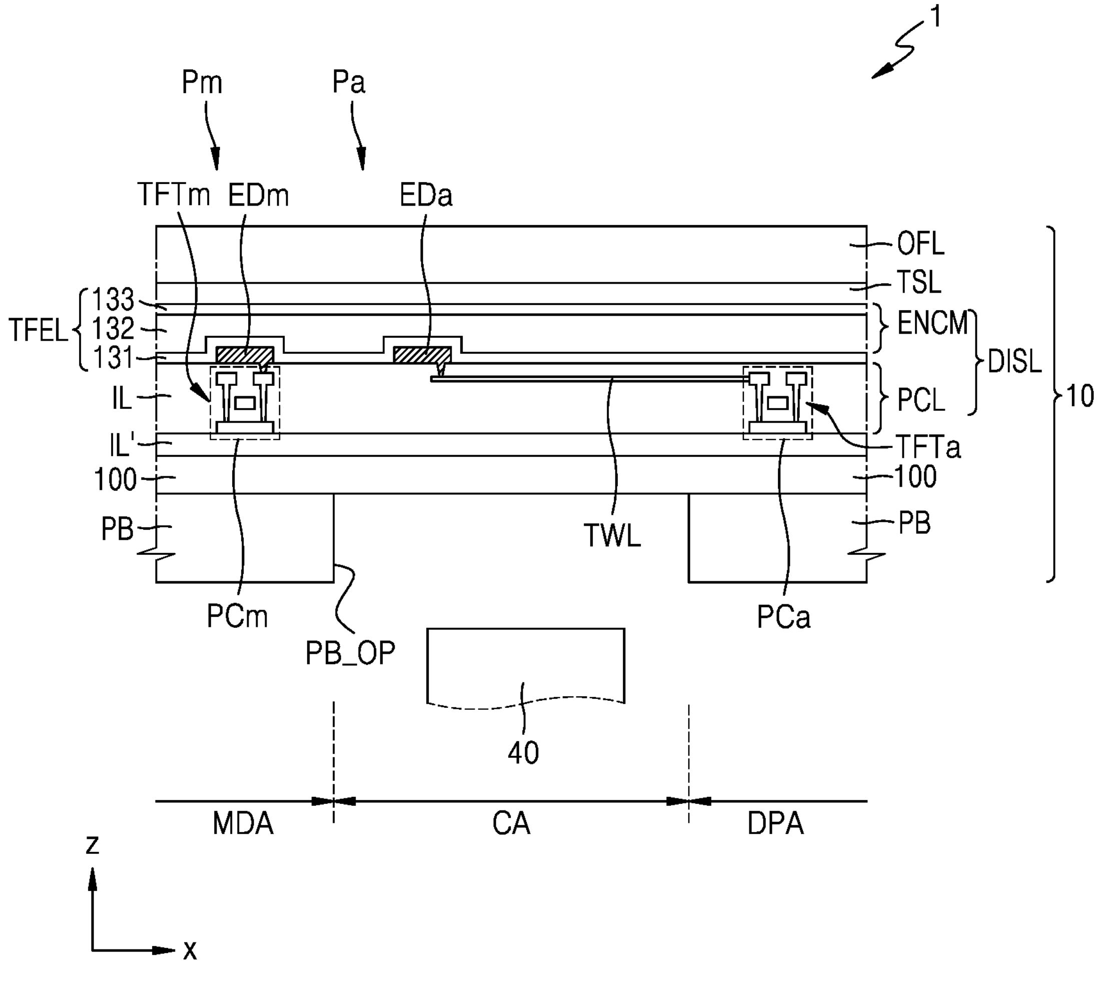
FIG. 2D is a cross-sectional view partially illustrating a display apparatus including an optical functional layer not including an opening according to an embodiment.

In another embodiment, as illustrated in FIG. 2D, the optical functional layer OFL may not include an opening, and the body of the optical functional layer OFL may be continuously provided on the component area CA entirely.

Figure 3A:
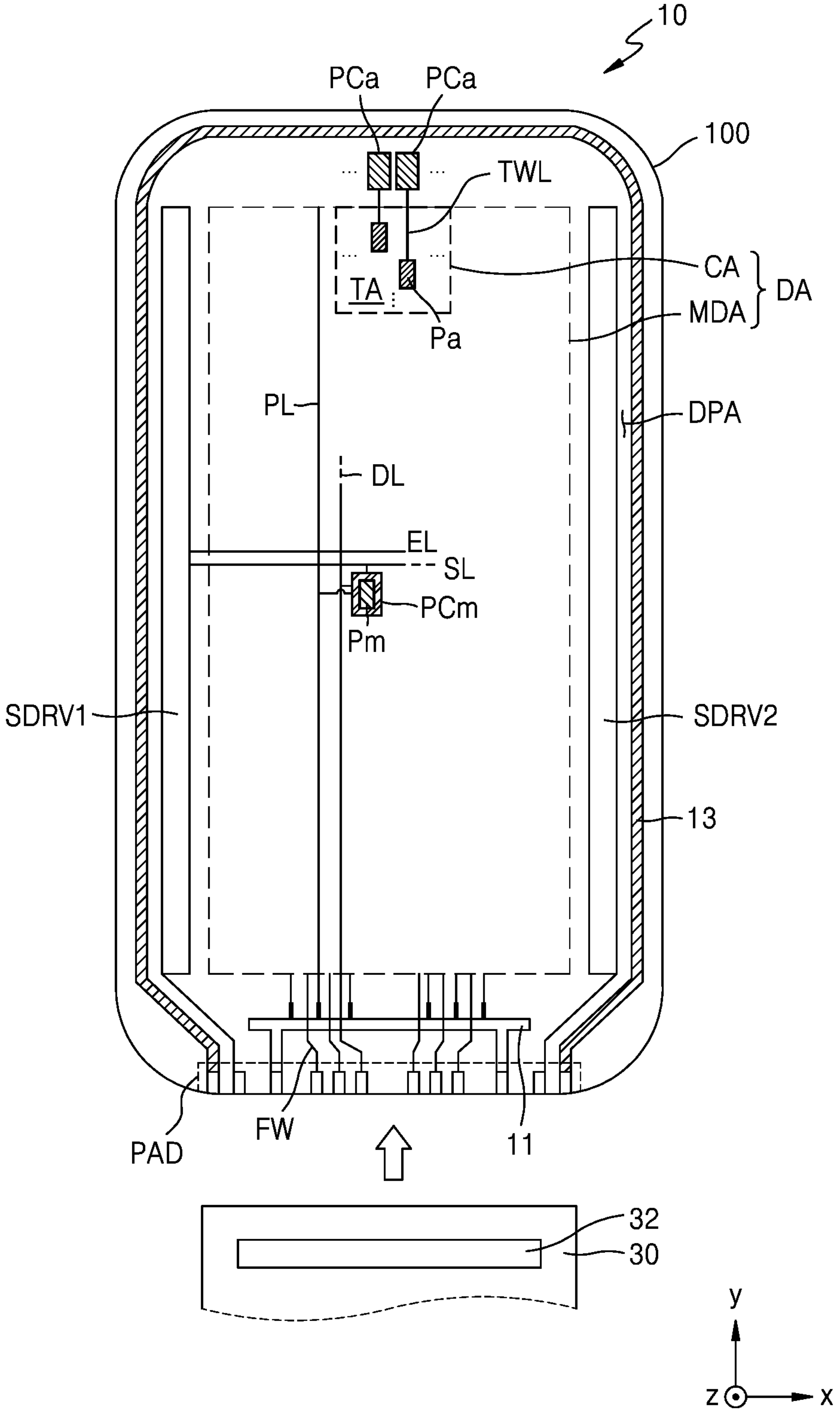
FIGS. 3A and 3B are plan views of a display panel that may be included in the display apparatus of FIG. 1.
Figure 3B:
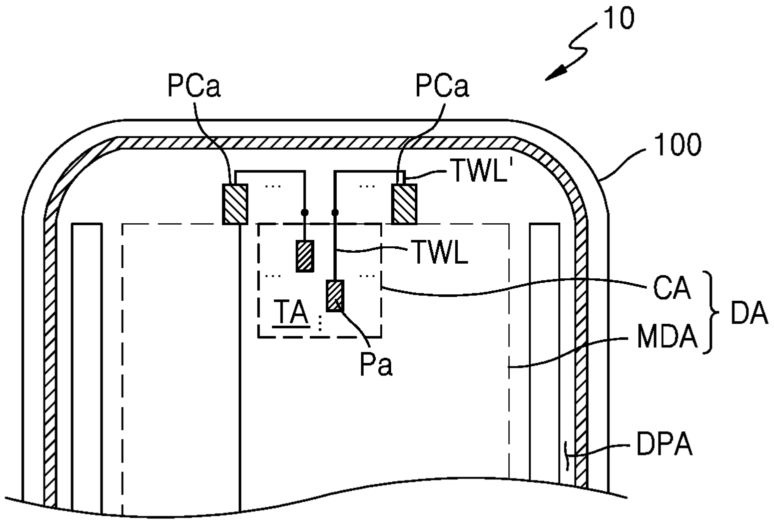

FIGS. 3A and 3B are plan views of a display panel 10 that may be included in the display apparatus 1 of FIG. 1.

Referring to FIG. 3A, various elements of the display panel 10 are on the substrate 100. The substrate 100 includes the display area DA and the peripheral area DPA surrounding the display area DA. The display area DA includes the main display area MDA displaying a main image, and the component area CA having the transmission area TA and displaying an auxiliary image. The auxiliary image may form one total image with a main image or may be an image independent from the main image.

A plurality of main sub-pixels Pm are arranged in the main display area MDA. Each of the plurality of main sub-pixels Pm may be implemented as a display element, such as an organic light-emitting diode OLED. The main pixel circuit PCm driving the main sub-pixel Pm is in the main display area MDA, and the main pixel circuit PCm may overlap the main sub-pixel Pm. Each of the main sub-pixels Pm may emit, for example, red light, green light, blue light, or white light. The main display area MDA is covered by an encapsulation member to be protected from external air or moisture.

The component area CA may be at a side of the main display area MDA as described above, or may be in the display area DA to be surrounded by the main display area MDA. A plurality of auxiliary sub-pixels Pa are arranged in the component area CA. Each of the auxiliary sub-pixels Pa may include a display element such as an organic light-emitting diode. The auxiliary pixel circuit PCa driving the auxiliary sub-pixel Pa may be in the peripheral area DPA that is adjacent to the component area CA. For example, when the component area CA is on an upper side of the display area DA, the auxiliary pixel circuit PCa may be on the upper side of the peripheral area DPA. The display elements included in the auxiliary pixel circuit PCa and the auxiliary sub-pixel Pa may be connected to each other via the connecting line TWL extending in the y-direction.

Each of the auxiliary sub-pixels Pa may emit, for example, red light, green light, blue light, or white light. The component area CA is covered by an encapsulation member to be protected from external air or moisture.

In addition, the component area CA may include the transmission area TA. The transmission area TA may surround the plurality of auxiliary sub-pixels Pa. Alternatively, the transmission area TA may be arranged as gratings with the plurality of auxiliary sub-pixels Pa.

Because the component area CA has the transmission area TA, a resolution of the component area CA may be less than that of the main display area MDA. For example, the resolution of the component area CA may be about 1/2, 3/8, 1/3, 1/4, 2/9, 1/8, 1/9, 1/16, etc. of the resolution of the main display area MDA. For example, the main display area MDA may have a resolution of about 400 ppi, and the component area CA may have a resolution of about 200 ppi or about 100 ppi.

Each of the pixel circuits driving the sub-pixels Pm and Pa may be electrically connected to external circuits in the peripheral area DPA. A first scan driving circuit SDRV1, a second scan driving circuit SDRV2, a terminal portion PAD, a driving voltage supply line 11, and a common voltage supply line 13 may be in the peripheral area DPA.

The first scan driving circuit SDRV1 may apply a scan signal to each of the main pixel circuits PCm that drive the main sub-pixels Pm via a main scan line SLm. The first scan driving circuit SDRV1 may apply an emission control signal to each of the pixel circuits PCm via a main emission control line ELm. The second scan driving circuit SDRV2 may be opposite to the first scan driving circuit SDRV1 based on the main display area MDA, and may be in parallel with the first scan driving circuit SDRV1. Some of the pixel circuits of the main sub-pixels Pm in the main display area MDA may be electrically connected to the first scan driving circuit SDRV1, and the other pixel circuits may be electrically connected to the second scan driving circuit SDRV2.

The terminal portion PAD may be at a side of the substrate 100. The terminal portion PAD is not covered by the insulating layer, but is exposed to be connected to a display circuit board 30. A display driver 32 may be on the display circuit board 30.

The display driver 32 may generate control signals that are to be transferred to the first scan driving circuit SDRV1 and the second scan driving circuit SDRV2. The display driver 32 may generate a data signal, and the data signal may be transferred to the main pixel circuits PCm via a fan-out wire FW and a main data line DLm connected to the fan-out wire FW.

Also, the display driver 32 may supply a driving voltage ELVDD to the driving voltage supply line 11 and may supply a common voltage ELVSS to the common voltage supply line 13. The driving voltage ELVDD may be applied to pixel circuits of the main and auxiliary sub-pixels Pm and Pa via the driving voltage line PL connected to the driving voltage supply line 11, and the common voltage ELVSS may be applied to an opposite electrode of the display element via the common voltage supply line 13.

The driving voltage supply line 11 may extend in the x-direction under the main display area MDA. The common voltage supply line 13 may have a loop shape having one open side to partially surround the main display area MDA.

FIG. 3A illustrates one component area CA, but a plurality of component areas CA may be provided. In this case, the plurality of component areas CA are separated from one another, and a first camera may correspond to one component area CA and a second camera may correspond to another component area CA. Alternatively, a camera may correspond to one component area CA and an infrared ray sensor may correspond to another component area CA. Shapes and sizes of the plurality of component areas CA may be different from one another.

In addition, the component area CA may have a circular shape, an elliptical shape, a polygonal shape, or a non-defined shape. In some embodiments, the component area CA may have an octagonal shape. The component area CA may have various polygonal shapes, e.g., a rectangular shape, a hexagonal shape, etc. The component area CA may be surrounded by the main display area MDA.

Also, in FIG. 3A, the auxiliary pixel circuit PCa is arranged adjacent to an outer side of the component area CA, but one or more embodiments are not limited thereto. As illustrated in FIG. 3B, the auxiliary pixel circuit PCa may be arranged adjacent to an outer side of the main display area MDA. In some embodiments, the connecting line TWL may be connected to the auxiliary pixel circuit PCa via a metal connecting line TWL'. In this case, the connecting line TWL may be in the component area CA, and the metal connecting line TWL' may be in the peripheral area DPA. The connecting line TWL may include a transparent conductive material, and the metal connecting line TWL' may include highly conductive metal. In some embodiments, the metal connecting line TWL' may be at the same layer as that of the connecting line TWL. In another embodiment, the metal connecting line TWL' may be at a different layer from that of the connecting line TWL and may be connected to the connecting line TWL via a contact hole.

Figure 4:
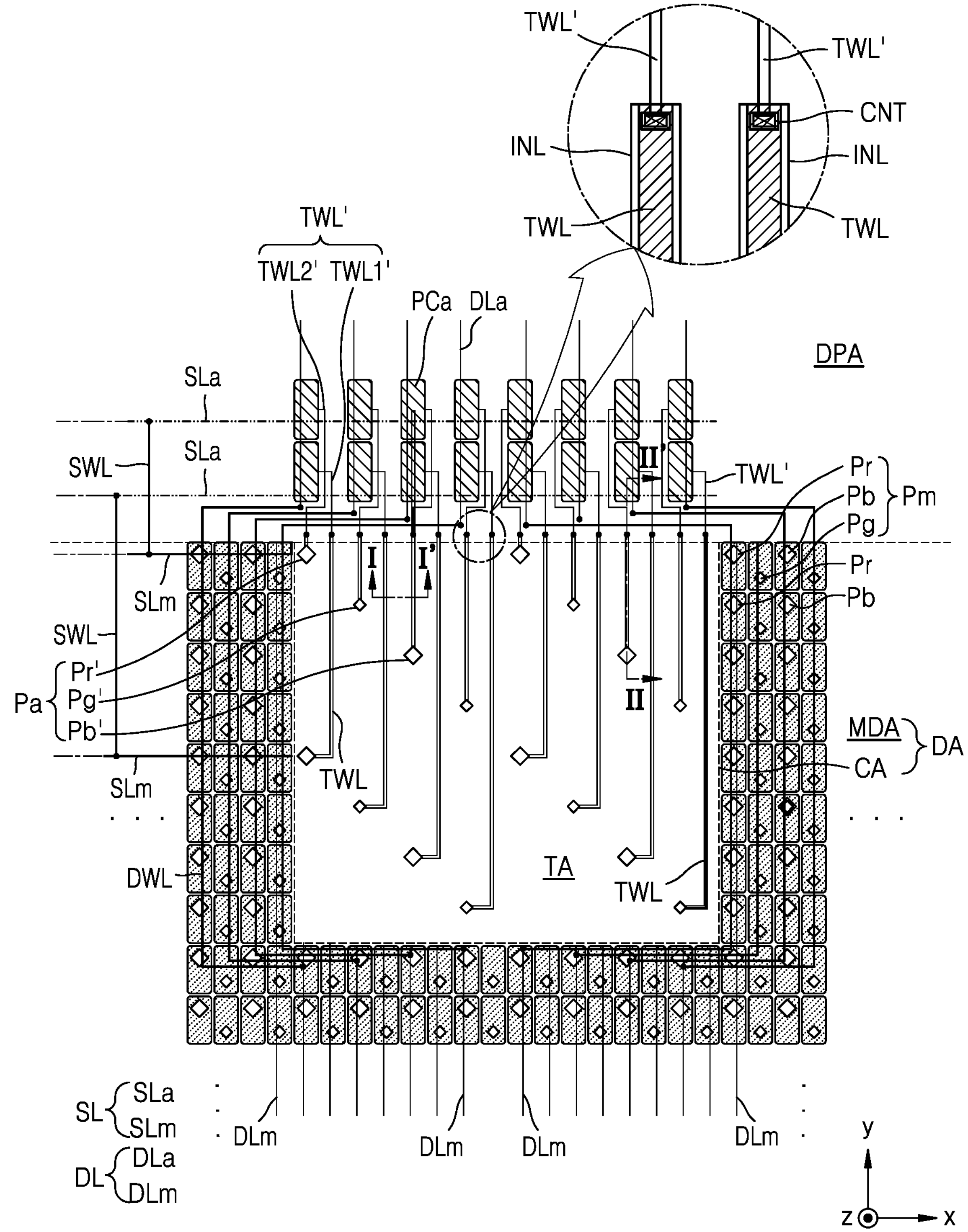
FIG. 4 is a plan layout illustrating a region of a display panel according to an embodiment.

FIG. 4 is a plan layout illustrating a region of a display panel according to an embodiment. In detail, FIG. 4 illustrates the component area CA, the main display area MDA around the component area CA, and a part of the peripheral area DPA.

Referring to FIG. 4, a plurality of main sub-pixels Pm may be in the main display area MDA. In the specification, the sub-pixel is a minimum unit configured to realize an image and denotes a light-emitting region from which light is emitted by a display element. When an organic light-emitting diode is used as a display element, the light-emitting region may be defined by the opening of a pixel defining layer. This will be described later. Each of the plurality of main sub-pixels Pm may emit one of red light, green light, blue light, and white light.

In some embodiments, the main sub-pixels Pm in the main display area MDA may include a first sub-pixel Pr, a second sub-pixel Pg, and a third sub-pixel Pb. The first sub-pixel Pr, the second sub-pixel Pg, and the third sub-pixel Pb may respectively emit red light, green light, and blue light. The main sub-pixels Pm may be arranged in a Pentile structure.

For example, from among vertices of a virtual square having a central point of the second sub-pixel Pg as a central point of the square, the first sub-pixel Pr is at first and third vertices and the third sub-pixel Pb may be at second and fourth vertices. A size of the second sub-pixel Pg may be less than those of the first sub-pixel Pr and the third sub-pixel Pb.

This pixel arrangement structure is referred to as a Pentile matrix structure or a Pentile structure. By applying rendering, in which a color of a pixel is represented by sharing the colors of its adjacent pixels, a high resolution may be obtained via a small number of pixels.

FIG. 4 illustrates that the plurality of main sub-pixels Pm are arranged in the Pentile matrix structure, but one or more embodiments are not limited thereto. For example, the plurality of main sub-pixels Pm may be arranged in various shapes, e.g., a stripe structure, a mosaic arrangement structure, a delta arrangement structure, etc.

In the main display area MDA, the main pixel circuits PCm may overlap the main sub-pixels Pm, and the main pixel circuits PCm may be arranged in the form of a matrix in the x and y directions. In the specification, the main pixel circuit PCm denotes a unit of a pixel circuit included in one main sub-pixel Pm.

A plurality of auxiliary sub-pixels Pa may be in the component area CA. Each of the plurality of main sub-pixels Pm may emit one of red light, green light, blue light, and white light. The auxiliary sub-pixels Pa may include a first sub-pixel Pr', a second sub-pixel Pg', and a third sub-pixel Pb'. The first sub-pixel Pr', the second sub-pixel Pg', and the third sub-pixel Pb' may emit red light, green light, and blue light.

The number of auxiliary sub-pixels Pa per unit area in the component area CA may be less than the number of main sub-pixels Pm per unit area in the main display area MDA. For example, the number of auxiliary sub-pixels Pa and the number of main sub-pixels Pm in the same area may be in a ratio of 1:2, 1:4, 1:8, or 1:9. That is, a resolution of the component area CA may be ½, ¼, ⅛, or 1/9 of a resolution of the main display area MDA. FIG. 4 illustrates an example in which the component area CA has a resolution that is about ⅛ of the resolution of the main display area MDA.

The auxiliary sub-pixels Pa in the component area CA may be arranged in various shapes. Some of the auxiliary sub-pixels Pa may be grouped as a pixel group, and in the pixel group, the auxiliary sub-pixels Pa may be arranged in various shapes, e.g., a stripe structure, a mosaic arrangement structure, and a delta arrangement structure, etc. Here, a distance between the auxiliary sub-pixels Pa in the pixel group may be equal to a distance between the main sub-pixels Pm.

Alternatively, as illustrated in FIG. 4, the auxiliary sub-pixels Pa may be distributed in the component area CA. That is, the distance between the auxiliary sub-pixels Pa may be greater than that between the main sub-pixels Pm. In addition, a region where the auxiliary sub-pixels Pa are not provided in the component area CA may be the transmission area TA having high light transmittance.

The auxiliary pixel circuits PCa realizing the light emission from the auxiliary sub-pixels Pa may be in the peripheral area DPA. Because the auxiliary pixel circuits PCa are not in the component area CA, the component area CA may have a relatively large transmission area TA, which may be referred to as a wide transmission area. Also, lines applying a constant voltage and signals to the auxiliary pixel circuits PCa are not in the component area CA, and thus the auxiliary sub-pixels Pa may be freely arranged without considering the arrangement of the lines.

The auxiliary pixel circuits PCa may be connected to the auxiliary sub-pixels Pa via the connecting lines TWL and/or the metal connecting lines TWL'.

The connecting line TWL is at least partially in the component area CA and may include a transparent conductive material. For example, the connecting line TWL may include a transparent conducting oxide (TCO). For example, the connecting line TWL may include a conductive oxide such as indium tin oxide (ITO), indium zinc oxide (IZO), zinc oxide (ZnO), indium oxide ($In_2O_3$), indium gallium oxide, or aluminum zinc oxide (AZO).

That the connecting line TWL is connected to the auxiliary sub-pixel Pa may denote that the connecting line TWL is electrically connected to the pixel electrode of the display element included in the auxiliary sub-pixel Pa.

The connecting line TWL may be connected to the auxiliary pixel circuits PCa via the metal connecting line TWL'. The metal connecting line TWL' may be in the peripheral area DPA and connected to the auxiliary pixel circuit PCa.

The metal connecting line TWL' may include a conductive material including molybdenum (Mo), aluminum (Al), copper (Cu), titanium (Ti), etc., and may have a single-layered or multi-layered structure. A plurality of metal connecting lines TWL' may be among the auxiliary pixel circuits PCa.

In some embodiments, the metal connecting line TWL' may include a first metal connecting line TWL1' and a second metal connecting line TWL2' at different layers. For example, the first metal connecting line TWL1' may be at the same layer as the data line DL and may include the same material as that of the data line DL. The second metal connecting line TWL2' and the first metal connecting line TWL1' may be arranged with an insulating layer therebetween. For example, the second metal connecting line TWL2' may be at the same layer as a pixel electrode 121 (see FIG. 5) of the organic light-emitting diode OLED and may include the same material as that of the first pixel electrode 121. Alternatively, the second metal connecting line TWL2' may be at the same layer as a connecting electrode CM (see FIG. 5) and may include the same material as that of the connecting electrode CM.

The first metal connecting line TWL1' and the second metal connecting line TWL2' may be between the auxiliary pixel circuits PCa and at least partially curved on a plane. In some embodiments, there may be a plurality of first metal connecting lines TWL1' and a plurality of second metal connecting lines TWL2' at different layers, and the first metal connecting lines TWL1' and the second metal connecting lines TWL2' may be alternately arranged in spaces among the plurality of pixel circuits PCa.

The connecting line TWL may be in the component area CA and may be connected to the metal connecting line TWL' at an edge of the component area CA. The connecting line TWL may include a transparent conductive material.

Referring to a partially enlarged view of FIG. 4, an insulating line INL overlapping the connecting line TWL may be on and/or under the connecting line TWL. In some embodiments, the insulating line INL may be patterned to correspond to the connecting line TWL. There are a plurality of insulating lines INL, and the plurality of insulating lines INL may be spaced apart from one another in an x-direction and may extend in a y-direction.

In some embodiments, the insulating line INL may be disposed between the connecting line TWL and the metal connecting line TWL1'. In this case, the connecting line TWL may be connected to the metal connecting line TWL' via a contact hole CNT in the insulating line INL.

When the insulating line INL is on the connecting line TWL, the connecting line TWL may be on the first organic insulating layer 116, that is, at the same layer as that of the metal connecting line TWL'. In this case, an end portion of the connecting line TWL may cover an end portion of the metal connecting line TWL'.

The metal connecting line TWL' may have a higher conductivity than that of the connecting line TWL. Because the metal connecting line TWL' is in the peripheral area DPA, there is no need to ensure light transmittance. Thus, the additional connecting line TWL' may include a material having lower light transmittance and higher conductivity than those of the connecting line TWL. Accordingly, a resistance of the connecting line TWL may be reduced.

The scan line SL may include a main scan line SLm connected to the main pixel circuits PCm and an auxiliary scan line SLa connected to the auxiliary pixel circuits PCa. The main scan line SLm extends in the x-direction to be connected to the main pixel circuits PCm on a same row. The main scan line SLm may not be in the component area CA. That is, the main scan line SLm may be disconnected at the component area CA. In this case, the main scan line SLm at a left side of the component area CA may receive a signal from the first scan driving circuit SDRV2 (see FIG. 3A), and the main scan line SLm at a right side of the component area CA may receive a signal from the first scan driving circuit SDRV1 (see FIG. 3A).

The auxiliary scan line SLa may be connected to the auxiliary pixel circuits PCa that drive the auxiliary sub-pixels Pa in the same row, from among the auxiliary pixel circuits PCa in the same row.

The main scan line SLm and the auxiliary scan line SLa are connected to a scan connecting line SWL, and thus, a same signal may be applied to the pixel circuits driving the main sub-pixel Pm and the auxiliary sub-pixel Pa in the same row.

The scan connecting line SWL may be at a different layer from the main scan line SLm and the auxiliary scan line SLa, and thus, the scan connecting line SWL may be connected to the main scan line SLm and the auxiliary scan line SLa respectively via contact holes. The scan connecting line SWL may be in the peripheral area DPA.

The data line DL may include a main data line DLm connected to the main pixel circuits PCm and an auxiliary data line DLa connected to the auxiliary pixel circuits PCa. The main data line DLm extends in the y-direction and may be connected to the main pixel circuits PCm in the same column. The auxiliary data line DLa extends in the y-direction and may be connected to the auxiliary pixel circuits PCa in the same column.

The main data line DLm and the auxiliary data line DLa may be separated from each other with the component area CA therebetween. The main data line DLm and the auxiliary data line DLa are connected to a data connecting line DWL, and thus, a same signal may be applied to the pixel circuits driving the main sub-pixel Pm and the auxiliary sub-pixel Pa in the same column.

The data connecting line DWL may bypass the component area CA. The data connecting line DWL may overlap the main pixel circuits PCm in the main display area MDA. Because the data connecting line DWL is in the main display area MDA, an additional space configured to rearrange the data connecting line DWL may not be necessary, and thus, an area of a dead space may be reduced.

The data connecting line DWL may be at a different layer from the main data line DLm and the auxiliary data line DLa, and thus, the data connecting line DWL may be connected to the main data line DLm and the auxiliary data line DLa respectively via contact holes.

Figure 5:
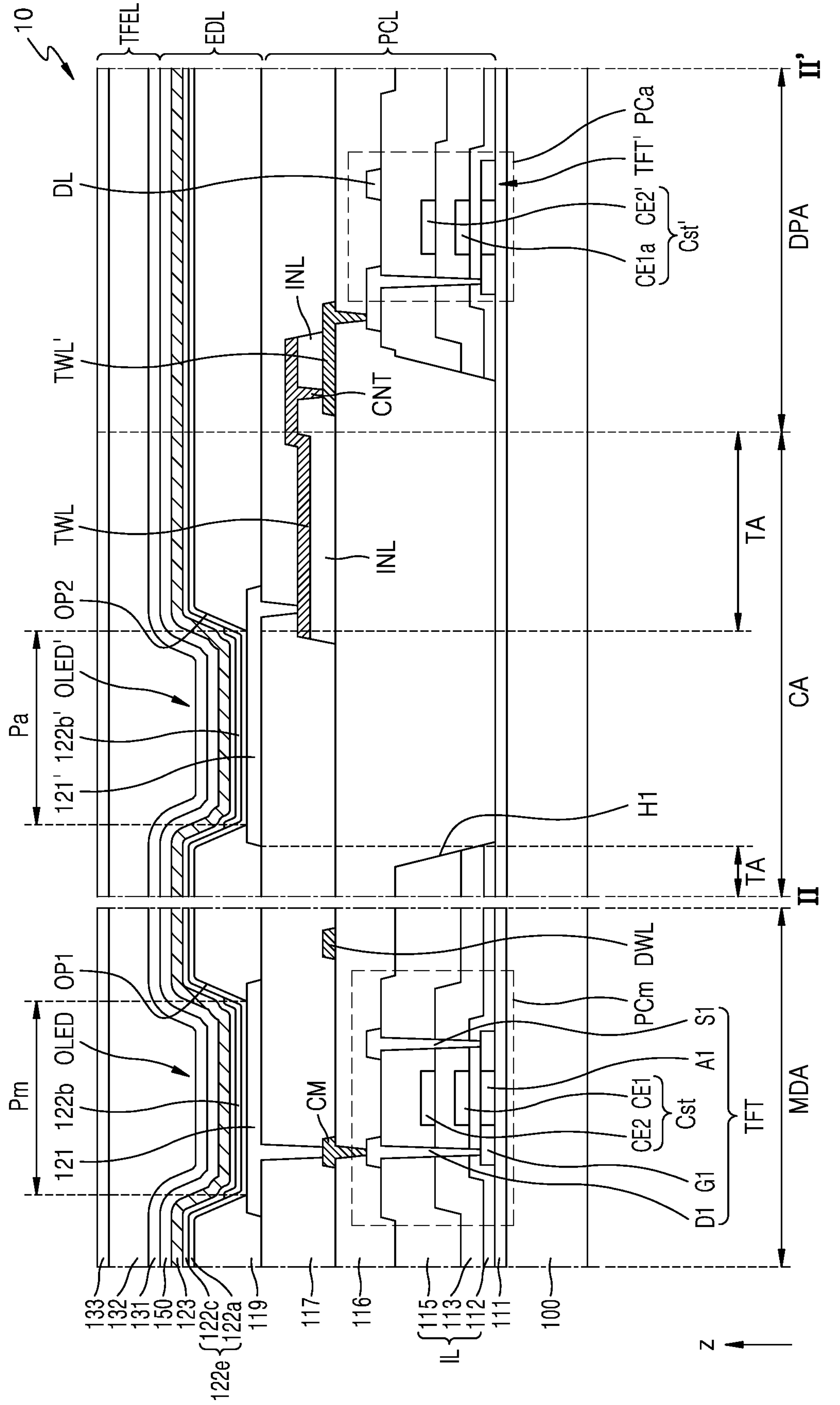
FIG. 5 is a cross-sectional view partially illustrating a display panel according to an embodiment.

FIG. 5 is a cross-sectional view illustrating a portion of the display panel 10 according to the embodiment, and partially illustrates the main display area MDA, the component area CA, and the peripheral area DPA. In FIG. 5, some parts of the component area CA and the peripheral area DPA correspond to the cross-sectional view taken along line of FIG. 4.

Referring to FIG. 5, the main sub-pixels Pm are in the main display area MDA, and the component area CA includes the auxiliary sub-pixels Pa and the transmission area TA. The main pixel circuit PCm including the main thin film transistor TFT and the main storage capacitor Cst and the main organic light-emitting diode OLED that is a main display element connected to the main pixel circuit PCm may be in the main display area MDA. An auxiliary organic light-emitting diode OLED' may be in the component area CA as an auxiliary display element. The auxiliary pixel circuit PCa including an auxiliary thin film transistor TFT' and the auxiliary storage capacitor Cst' may be in the peripheral area DPA. In addition, the connecting line TWL to connect the auxiliary pixel circuit PCa to the auxiliary organic light-emitting diode OLED' may be in the component area CA and the peripheral area DPA.

In the component area CA, a first organic insulating layer 116 and a second organic insulating layer 117 are stacked between the substrate 100 and the auxiliary organic light-emitting diode OLED', and the connecting line TWL may be between the first organic insulating layer 116 and the second organic insulating layer 117.

In the embodiment, the insulating line INL may be disposed on and/or under the connecting line TWL while overlapping the connecting line TWL in the component area CA in the z-direction. The insulating line INL is in direct contact with the connecting line TWL, and may be patterned to correspond to the connecting line TWL.

In some embodiment, the insulating line INL may be disposed between the first organic insulating layer 116 and the connecting line TWL as illustrated in FIG. 5. That is, the insulating line INL may be in direct contact with the connecting line TWL under the connecting line TWL. The insulating line INL may have a tapered shape extending between the connecting line TWL and the first organic insulating layer 116.

In this case, a refractive index n' of the insulating line INL may have a value between a refractive index n1 of the first organic insulating layer 116 and a refractive index n0 of the connecting line TWL. For example, the refractive index n' of the insulating line INL may be greater than the refractive index n1 of the first organic insulating layer 116 and may be less than the refractive index n0 of the connecting line TWL. (n0>n'>n1)

In some embodiments, the refractive index n0 of the connecting line TWL may be about 1.9 to about 2.1 with respect to a wavelength of 550 nm. The refractive index n' of the insulating line INL may be about 1.6 to about 1.8. The refractive index n1 of the first organic insulating layer 116 may be about 1.4 to about 1.6 with respect to the wavelength of 550 nm.

As a difference between the refractive index of the connecting line TWL and the refractive index of the insulating layers arranged under the connecting line TWL increases, a light diffraction intensity of the connecting line TWL may increase. In the embodiment, the insulating line INL having a material of a refractive index that is lower from that of the connecting line TWL is under the connecting line TWL, and thus, the light diffraction may be reduced.

In some embodiments, the second organic insulating layer 117 may have the same material as that of the first organic insulating layer 116. In another embodiment, the second organic insulating layer 117 may have a different material from that of the first organic insulating layer 116. For example, the first organic insulating layer 116 may include photosensitive polyimide and the second organic insulating layer 117 may include a siloxane-based resin. In this case, a light transmittance of the second organic insulating layer 117 may be greater than that of the first organic insulating layer 116. Also, a flatness of an upper surface of the second organic insulating layer 117 may be greater than that of an upper surface of the first organic insulating layer 116. That is, the upper surface of the second organic insulating layer 117 may be flatter than the upper surface of the first organic insulating layer 116.

When there is the first organic insulating layer 116 in the component area CA, there may be a loss in a total light transmittance and flatness, and thus, the second organic insulating layer 117 having greater light transmittance and flatness than those of the first organic insulating layer 116 may be adopted to reduce the light diffraction and to improve the light transmittance and flatness.

In the embodiment, the organic light-emitting diode is adopted as the display element, but in another embodiment, an inorganic light-emitting diode or a quantum dot light-emitting diode may be adopted as the display element.

Hereinafter, a structure in which the elements in the display panel 10 are stacked will be described below. The display panel 10 may include a substrate 100, a buffer layer 111, a circuit layer PCL, and a display element layer EDL that are stacked.

The substrate 100 may include an insulating material, such as glass, quartz, and polymer resin. The substrate 100 may include a rigid substrate or a flexible substrate that may be bendable, foldable, and rollable.

The buffer layer 111 is on the substrate 100 to reduce or block infiltration of impurities, moisture, or external air from a lower portion of the substrate 100, and to provide a flat surface on the substrate 100. The buffer layer 111 may include an inorganic material such as an oxide material or a nitride material, an organic material, or an inorganic-organic composite material, and may have a single-layered or multi-layered structure including the inorganic material and the organic material. A barrier layer (not illustrated) configured to prevent infiltration of external air may be further provided between the substrate 100 and the buffer layer 111. In some embodiments, the buffer layer 111 may include silicon oxide ($SiO_2$) or silicon nitride (SiNx).

The circuit layer PCL is on the buffer layer 111 and may include the main and auxiliary pixel circuits PCm and PCa, a first gate insulating layer 112, a second gate insulating layer 113, an interlayer insulating layer 115, the first organic insulating layer 116, and the second organic insulating layer 117. The main pixel circuit PCm may include the main thin film transistor TFT and the main storage capacitor Cst, and the auxiliary pixel circuit PCa may include the auxiliary thin film transistor TFT' and the auxiliary storage capacitor Cst'.

The main thin film transistor TFT and the auxiliary thin film transistor TFT' may be on the buffer layer 111. The main thin film transistor TFT includes the first semiconductor layer A1, the first gate electrode G1, the first source electrode S1, and the first drain electrode D1. The main thin film transistor TFT is connected to a main organic light-emitting diode OLED and may drive the main organic light-emitting diode OLED. The auxiliary thin film transistor TFT' is connected to the auxiliary organic light-emitting diode OLED' and may drive the auxiliary organic light-emitting diode OLED'. The auxiliary thin film transistor TFT' has a similar configuration to that of the main thin film transistor TFT, and thus, descriptions about the main thin film transistor TFT may apply to the description about the auxiliary thin film transistor TFT'.

The first semiconductor layer A1 is on the buffer layer 111, and may include polysilicon. In another embodiment, the first semiconductor layer A1 may include amorphous silicon. In another embodiment, the first semiconductor layer A1 may include an oxide of at least one selected from the group consisting of indium (In), gallium (Ga), stannum (Sn), zirconium (Zr), vanadium (V), hafnium (Hf), cadmium (Cd), germanium (Ge), chrome (Cr), titanium (Ti), and zinc (Zn). The first semiconductor layer A1 may include a channel region, and a source region and a drain region doped with impurities.

The first gate insulating layer 112 may cover the first semiconductor layer A1. The first gate insulating layer 112 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_2$). The first gate insulating layer 112 may have a single-layered or a multi-layered structure including the inorganic insulating material.

The first gate electrode G1 is on the first gate insulating layer 112 to overlap the first semiconductor layer A1. The first gate electrode G1 may include molybdenum (Mo), aluminum (Al), copper (Cu), titanium (Ti), etc., and may have a single-layered or multi-layered structure. As an example, the first gate electrode G1 may have a single Mo layer.

The second gate insulating layer 113 may cover the first gate electrode G1. The second gate insulating layer 113 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_2$). The second gate insulating layer 113 may have a single-layered or a multi-layered structure including the inorganic insulating material.

An upper electrode CE2 of the main storage capacitor Cst and the upper electrode CE2' of the auxiliary storage capacitor Cst' may be on the second gate insulating layer 113.

In the main display area MDA, the upper electrode CE2 of the main storage capacitor Cst may overlap the first gate electrode G1 thereunder. The first gate electrode G1 and the upper electrode CE2 overlapping each other with the second gate insulating layer 113 therebetween may configure the main storage capacitor Cst. The first gate electrode G1 may be a lower electrode CE1 of the main storage capacitor Cst.

In the peripheral area DPA, the upper electrode CE2' of the auxiliary storage capacitor Cst' may overlap the gate electrode of the auxiliary thin film transistor TFT' thereunder. The gate electrode of the auxiliary thin film transistor TFT' may be a lower electrode CE1' of the auxiliary storage capacitor Cst'.

The upper electrodes CE2 and CE2' may each include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu) in a single-layered or multi-layered structure.

The interlayer insulating layer 115 may cover the upper electrodes CE2 and CE2'. The interlayer insulating layer 115 may include an insulating material such as silicon oxide ($SiO_2$), silicon nitride (SiNx), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_2$). The interlayer insulating layer 115 may have a single-layered or a multi-layered structure including the inorganic insulating material.

The source electrode S1 and the drain electrode D1 may be on the interlayer insulating layer 115. The source electrode S1 and the drain electrode D1 may include a conductive material including molybdenum (Mo), aluminum (Al), copper (Cu), titanium (Ti), etc., and may have a single-layered or multi-layered structure including the above materials. For example, the source electrode S1 and the drain electrode D1 may each have a multi-layered structure including Ti/Al/Ti.

The inorganic insulating layer IIL of the display panel 10 may include a hole or a groove corresponding to the component area CA. For example, when the first gate insulating layer 112, the second gate insulating layer 113, and the interlayer insulating layer 115 are collectively referred to as the inorganic insulating layer IL, the interlayer insulating layer IL may include a first hole H1 corresponding to the transmission area TA. The first hole H1 may partially expose an upper surface of the buffer layer 111 or the substrate 100. The first hole H1 may be formed when an opening of the first interlayer insulating layer 112, an opening of the second gate insulating layer 113, and an opening of the interlayer insulating layer 115 overlap one another, wherein the holes correspond to the component area CA. The openings may be separately formed through separate processes or simultaneously formed through the same process. When the openings are separately formed through separate processes, an internal surface of the first hole H1 may not be smoothly formed, but may have steps. Alternatively, the inorganic insulating layer IL may include a groove, not the first hole H1 exposing the buffer layer 111. The first organic insulating layer 116 may be filled in the hole or the groove of the inorganic insulating layer IL.

The first organic insulating layer 116 may cover the source electrodes S1 and S2 and the drain electrodes D1 and D2 of the main display area MDA and the peripheral area DPA, and may fill the hole or groove of the inorganic insulating layer IL in the component area CA.

The first organic insulating layer 116 may include photosensitive polyimide, polyimide, polystyrene (PS), polycarbonate (PC), a general universal polymer such as benzocyclobutene (BCB), hexamethyldisiloxane (HMDSO), polymethylmethacrylate (PMMA), or polystyrene (PS), polymer derivatives having phenol groups, acryl-based polymer, imide-based polymer, aryl ether-based polymer, amide-based polymer, fluoride-based polymer, p-xylene-based polymer, vinyl alcohol-based polymer, etc.

Alternatively, the first organic insulating layer 116 may include a siloxane-based organic material. The siloxane-based organic material may include hexamethyldisiloxane, octamethyltrisiloxane, decamethyltetrasiloxane, dodecamethylpentasiloxane, and polydimethylsiloxanes.

The refractive index n1 of the first organic insulating layer 116 may be about 1.4 to about 1.6 with respect to the wavelength of 550 nm. Connecting electrode CM, and various lines, e.g., data lines DWL, may be on the first organic insulating layer 116, and may be advantageous for high integration.

In addition, in the component area CA, the insulating line INL and the connecting line TWL may be stacked on the first organic insulating layer 116. The insulating line INL may be patterned to correspond to the connecting line TWL. When the insulating line INL is not patterned, but is formed entirely on the component area CA, the light transmittance of the component area CA may degrade. In the embodiment, because the insulating line INL is patterned, the light transmittance of the component area CA may be improved.

A refractive index n' of the insulating line INL may have a value between a refractive index n1 of the first organic insulating layer 116 and a refractive index n0 of the connecting line TWL. In some embodiments, the refractive index n' of the insulating line INL may be about 1.6 to about 1.8. The insulating line INL may include an inorganic insulating material. For example, the insulating line INL may include silicon oxynitride (SiOxNy) (x>0, y>0), aluminum oxide ($Al_2O_3$), etc. The insulating line INL may buffer the light diffraction effect caused due to a difference between the refractive indices of the first organic insulating layer 116 and the connecting line TWL.

The connecting line TWL connected to the auxiliary pixel circuit PCa may be on the insulating line INL. The connecting line TWL extends from the peripheral area DPA to the component area CA and may connect the auxiliary organic light-emitting diode OLED' to the auxiliary pixel circuit PCa.

The connecting line TWL may be connected to the metal connecting line TWL'. The metal connecting line TWL' is in the peripheral area DPA and may be connected to the auxiliary pixel circuit PCa, e.g., the auxiliary thin film transistor TFT'. The connecting line TWL may be in the transmission area TA of the component area CA. The connecting line TWL may be connected to the metal connecting line TWL' via the contact hole CNT in the insulating line INL.

The metal connecting line TWL' may include a conductive material including molybdenum (Mo), aluminum (Al), copper (Cu), titanium (Ti), etc., and may have a single-layered or multi-layered structure. In some embodiments, the metal connecting line TWL' may be at the same layer as that of the data line DL and may include the same material as that of the data line DL. However, one or more embodiments are not limited thereto. The metal connecting line TWL' may be at various layers. For example, the metal connecting line TWL' may be at the same layer as that of the first pixel electrode 121.

The connecting line TWL may include a transparent conductive material. For example, the connecting line TWL may include a transparent conducting oxide (TCO). The connecting line TWL may include a conductive oxide such as indium tin oxide (ITO), indium zinc oxide (IZO), zinc oxide (ZnO), indium oxide ($In_2O_3$), indium gallium oxide, or aluminum zinc oxide (AZO). The refractive index of the connecting line TWL may be about 1.9 to about 2.1.

The metal connecting line TWL' may have a higher conductivity than that of the connecting line TWL. Because the metal connecting line TWL' is in the peripheral area DPA, there is no need to ensure light transmittance. Thus, the additional connecting line TWL' may include a material having lower light transmittance and higher conductivity than those of the connecting line TWL.

The second organic insulating layer 117 may be on the first organic insulating layer 116, so as to cover the connecting line TWL. The second organic insulating layer 117 may have a flat upper surface so that a first pixel electrode 121 and a second pixel electrode 121' that will be arranged thereon may be planarized. The second organic insulating layer 117 may include a siloxane-based organic material having high light transmittance and flatness. The siloxane-based organic material may include hexamethyldisiloxane, octamethyltrisiloxane, decamethyltetrasiloxane, dodecamethylpentasiloxane, and polydimethylsiloxanes.

Alternatively, the second organic insulating layer 117 may include photosensitive polyimide, polyimide, a general universal polymer (benzocyclobutene (BCB), hexamethyldisiloxane (HMDSO), polymethylmethacrylate (PMMA), or polystyrene (PS)), polymer derivatives having phenol groups, acryl-based polymer, imide-based polymer, aryl ether-based polymer, amide-based polymer, fluoride-based polymer, p-xylene-based polymer, or vinyl alcohol-based polymer.

The main and auxiliary organic light-emitting diodes OLED and OLED' are on the second organic insulating layer 117. The first and second pixel electrodes 121 and 121' of the organic light-emitting diodes OLED and OLED' may be connected to the main and auxiliary pixel circuits PCm and PCa via the connecting electrodes CM and CM' on the first organic insulating layer 116.

The first pixel electrode 121 and the second pixel electrode 121' may include a conductive oxide such as indium tin oxide (ITO), indium zinc oxide (IZO), zinc oxide (ZnO), indium oxide ($In_2O_3$), indium gallium oxide, or aluminum zinc oxide (AZO). The first and second pixel electrodes 121 and 121' may each include a reflective layer including argentum (Ag), magnesium (Mg), aluminum (Al), platinum (Pt), palladium (Pd), aurum (Au), nickel (Ni), neodymium (Nd), iridium (Ir), chrome (Cr), or a compound thereof. For example, the first and second pixel electrodes 121 and 121' may each have a structure in which films including ITO, IZO, ZnO, or $In_2O_3$ are on/under the above-mentioned reflective layer. In this case, the first and second pixel electrodes 121 and 121' may each have a stacked structure including ITO/Ag/ITO.

The pixel defining layer 119 is on the second organic insulating layer 117 and covers edges of the first and second pixel electrodes 121 and 121', and may include a first opening OP1 and a second opening OP2 respectively exposing central portions of the first and second pixel electrodes

121 and 121'. Sizes and shapes of light-emitting regions, that is, sub-pixels Pm and Pa, in the organic light-emitting diodes OLED and OLED' are defined by the first opening OP1 and the second opening OP2.

The pixel defining layer 119 increases a distance between an edge of the first and second pixel electrodes 121 and 121' and an opposite electrode 123 on the first and second pixel electrodes 121 and 121' to prevent generation of an arc at the edge of the first and second pixel electrodes 121 and 121'. The pixel-defining layer 119 may include an organic insulating material such as polyimide, polyamide, acrylic resin, benzocyclobutene, hexamethyldisiloxane (HMDSO), and phenolic resin, and may be formed by spin coating.

A first emission layer 122*b* and a second emission layer 122*b*' respectively corresponding to the first pixel electrode 121 and the second pixel electrode 121' are in the first opening OP1 and the second opening OP2 of the pixel defining layer 119. The first emission layer 122*b* and the second emission layer 122*b*' may respectively include a polymer material or a low-molecular material, and may emit red light, green light, blue light, or white light.

An organic functional layer 122*e* may be on and/or under the first and second emission layers 122*b* and 122*b*'. The organic functional layer 122*e* may include a first functional layer 122*a* and/or a second functional layer 122*c*. The first functional layer 122*a* or the second functional layer 122*c* may be omitted.

The first functional layer 122*a* may be under the first emission layer 122*b* and the second emission layer 122*b*'. The first functional layer 122*a* may have a single-layered or multi-layered structure including an organic material. The first functional layer 122*a* may include a hole transport layer (HTL) having a single-layered structure. Alternatively, the first functional layer 122*a* may include a hole injection layer (HIL) and the HTL. The first functional layer 122*a* may be integrally provided to correspond to the organic light-emitting diodes OLED and OLED' in the main display area MDA and the component area CA.

The second functional layer 122*c* may be on the first emission layer 122*b* and the second emission layer 122*b*'. The second functional layer 122*c* may have a single-layered or multi-layered structure including an organic material. The second functional layer 122*c* may include an electron transport layer (ETL) and/or an electron injection layer (EIL). The second functional layer 122*c* may be integrally provided to correspond to the organic light-emitting diodes OLED and OLED' in the main display area MDA and the component area CA.

The opposite electrode 123 is on the second functional layer 122*c*. The opposite electrode 123 may include a conductive material having a low work function. For example, the opposite electrode 123 may include a (semi-) transparent layer including argentum (Ag), magnesium (Mg), aluminum (Al), platinum (Pt), palladium (Pd), aurum (Au), nickel (Ni), neodymium (Nd), iridium (Ir), chromium (Cr), lithium (Li), calcium (Ca), or an alloy thereof Alternatively, the opposite electrode 123 may further include a layer including ITO, IZO, ZnO, or $In_2O_3$ on the (semi-) transparent layer including the above material. The opposite electrode 123 may be integrally provided to correspond to the organic light-emitting diodes OLED and OLED' in the main display area MDA and the component area CA.

Layers from the first pixel electrode 121 and the opposite electrode 123 in the main display area MDA may configure the main organic light-emitting diode OLED. Layers from the second pixel electrode 121' to the opposite electrode 123 in the component area CA may configure the auxiliary organic light-emitting diode OLED'.

An upper layer 150 including an organic material may be on the opposite electrode 123. The upper layer 150 may be provided to protect the opposite electrode 123 and to improve light extraction efficiency. The upper layer 150 may include an organic material having a higher refractive index than that of the opposite electrode 123. Alternatively, the upper layer 150 may include stacked layers having different refractive indices. For example, the upper layer 150 may include a high refractive index layer/low refractive index layer/high refractive index layer. The high refractive index layer may have a refractive index of 1.7 or greater and the low refractive index layer may have a refractive index of 1.3 or less.

The upper layer 150 may additionally include LiF. Alternatively, the upper layer 150 may additionally include an inorganic insulating material such as silicon oxide ($SiO_2$) and silicon nitride (SiNx).

The thin film encapsulation layer TFEL is on the upper layer 150 such that the main and auxiliary organic light-emitting diodes OLED and OLED' may be encapsulated by the thin film encapsulation layer TFEL. The thin film encapsulation layer TFEL may prevent external moisture or impurities from infiltrating into the organic light-emitting diodes OLED and OLED'.

The thin film encapsulation layer TFEL may include at least one inorganic encapsulation layer and at least one organic encapsulation layer, and regarding this, FIG. 5 illustrates a structure of the thin film encapsulation layer TFEL, in which a first inorganic encapsulation layer 131, an organic encapsulation layer 132, and a second inorganic encapsulation layer 133 are stacked. In another embodiment, a stacking order and the number of organic and inorganic encapsulation layers may vary.

The first and second inorganic encapsulation layers 131 and 133 may each include one or more inorganic insulating materials such as silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$), and may be formed by a chemical vapor deposition (CVD) method, etc. The organic encapsulation layer 132 may include a polymer-based material. The polymer-based material may include a silicon-based resin, an acryl-based resin, an epoxy-based resin, polyimide, polyethylene, etc. The first inorganic encapsulation layer 131, the organic encapsulation layer 132, and the second inorganic encapsulation layer 133 may be integrally provided to cover the main display area MDA and the component area CA.

Figure 6A:
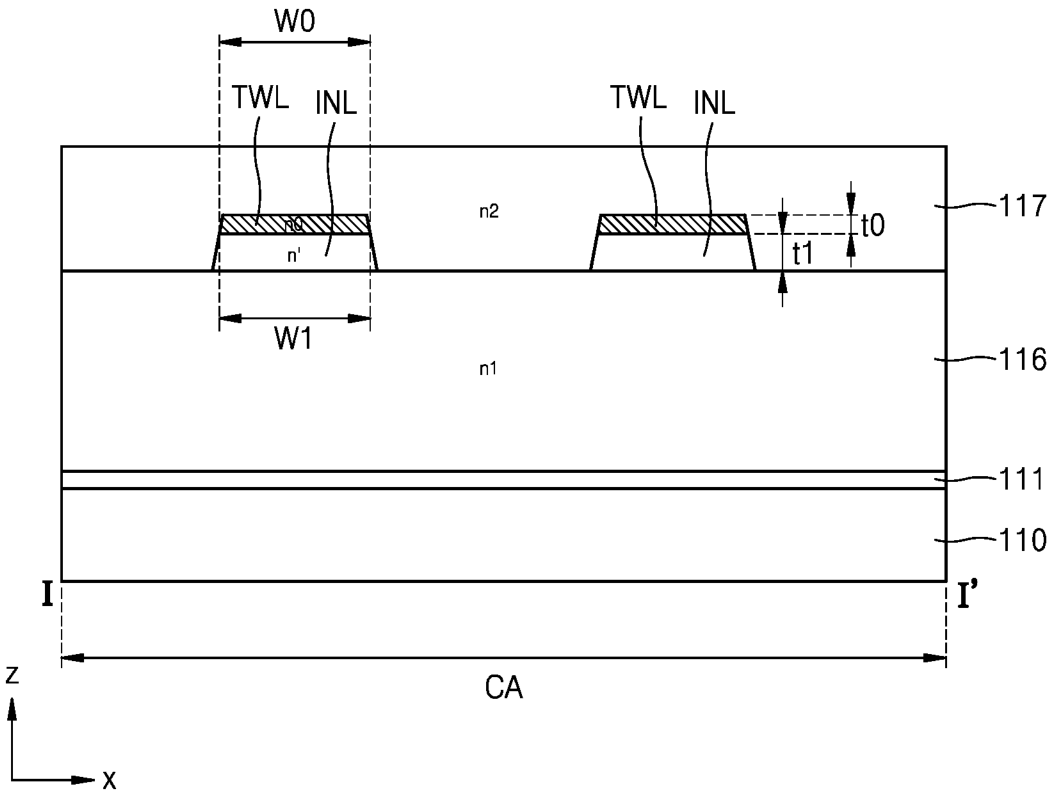
FIGS. 6A and 6B are cross-sectional views of the display panel taken along line I-I' of FIG. 4.
Figure 6B:
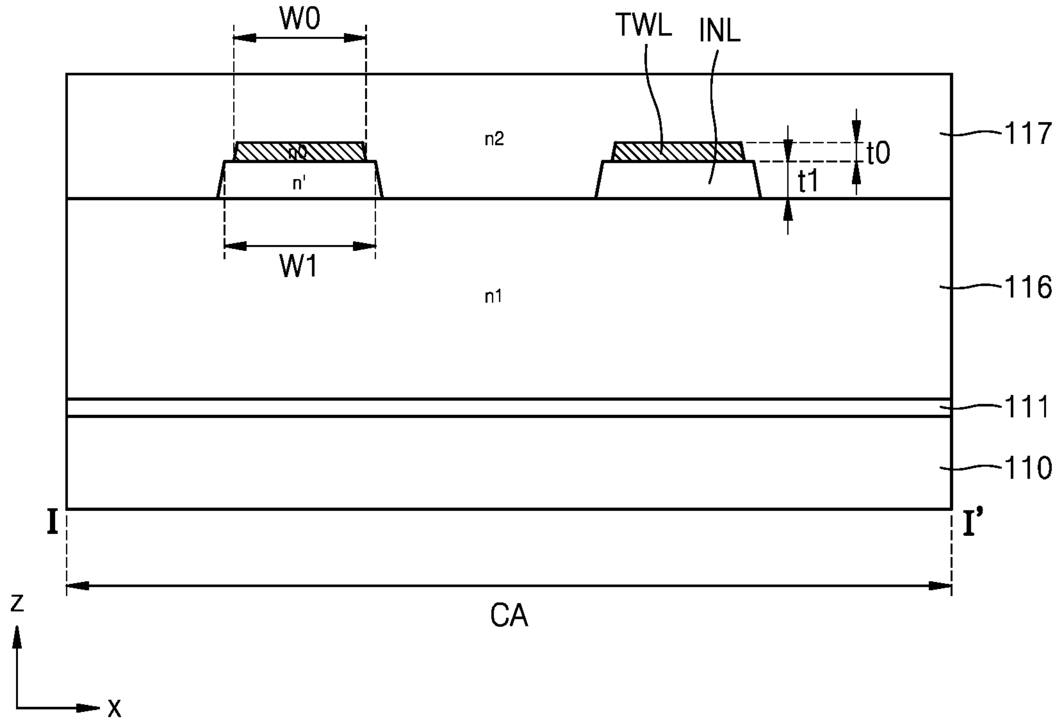

FIGS. 6A and 6B are cross-sectional views of the display panel taken along line I-I' of FIG. 4. In FIGS. 6A and 6B, like reference numerals denote the same elements as those of FIG. 5.

Referring to FIG. 6A, in the component area CA, the buffer layer 111, the first organic insulating layer 116, the insulating line INL, the connecting line TWL, and the second organic insulating layer 117 are sequentially stacked on the substrate 100. In this case, a refractive index n' of the insulating line INL may have a value between a refractive index n1 of the first organic insulating layer 116 and a refractive index n0 of the connecting line TWL. For example, the refractive index n' of the insulating line INL may be greater than the refractive index n1 of the first organic insulating layer 116 and may be less than the refractive index n0 of the connecting line TWL. (n0>n'>n1) In addition, a refractive index n2 of the substrate 100 and the second organic insulating layer 117 may be the same as or similar to the refractive index n1 of the first organic insulating layer 116. (n2≈n1) Accordingly, the light diffraction effect due to the refractive index difference rarely occurs on the region where the connecting line TWL is not provided.

In the embodiment, the insulating line INL is under the connecting line TWL, and thus, the light diffraction of the light passing through the connecting line TWL may be reduced.

When the insulating line INL is disposed underneath the connecting line TWL, a thickness t0 of the connecting line TWL may be less than a thickness t1 of the insulating line INL. For example, the thickness t0 of the connecting line TWL may be about 40 nm to about 60 nm, and the thickness t1 of the insulating line INL may be about 80 nm to about 120 nm. In the above range, the light transmittance is the largest and the reflectivity is the smallest in the component area CA.

In addition, the connecting lines TWL and the insulating lines INL in the component area CA may be patterned in the same shapes. In some embodiments, a width W0 of a lower end of the connecting line TWL in the x-direction may be equal to a width W1 of an upper end of the insulating line INL in the x-direction. In some embodiments, a width of each of the connecting lines TWL and the insulating lines INL in the x-direction may be about 2 μm to about 6 μm. An interval between the connecting lines TWL and the insulating lines INL may be about 2 μm to about 6 μm.

In FIG. 6A, the width W0 of a lower end of the connecting line TWL in the x-direction may be equal to the width W1 of an upper end of the insulating line INL in the x-direction, but one or more embodiments are not limited thereto.

As illustrated in FIG. 6B, the width W0 of the connecting line TWL in the x-direction and the width W1 of the insulating line INL in the x-direction may be different from each other. For example, the width W1 of the insulating line INL in the x-direction may be greater than the width W0 of the connecting line TWL in the x-direction. Also, unlike the example of FIG. 6B, the width W1 of the insulating line INL in the x-direction may be less than the width W0 of the connecting line TWL in the x-direction.

In addition, a center line of the connecting line TWL coincides with a center line of the insulating line INL in the drawing, but one or more embodiments are not limited thereto. The center line of the connecting line TWL may not match with the center line of the insulating line INL, but may be variously modified, e.g., may be biased to one side.

Figure 7A:
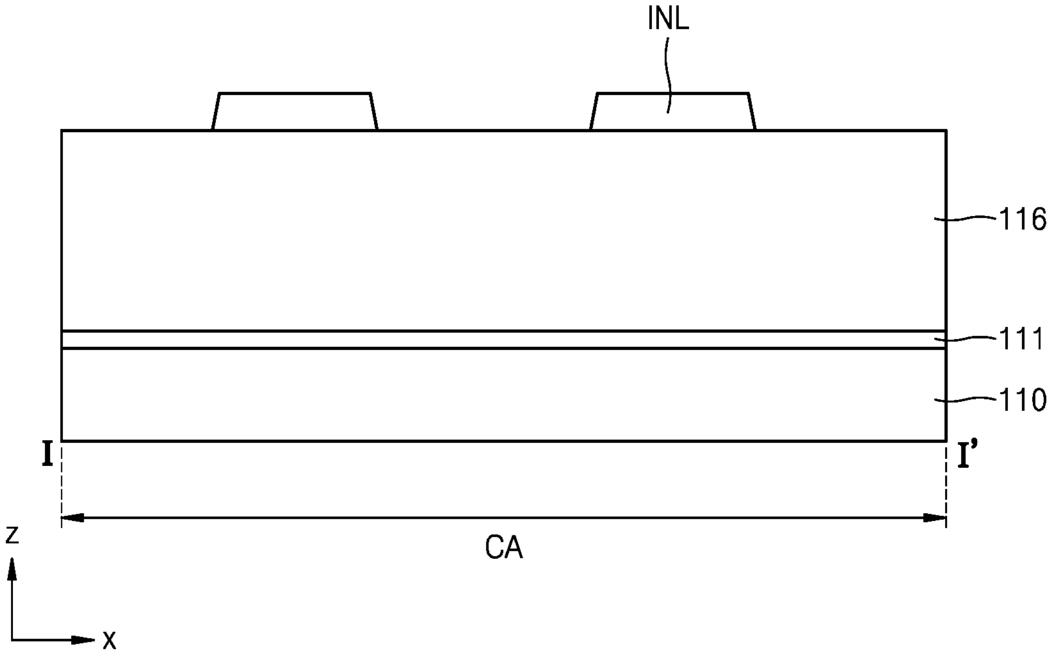
FIGS. 7A, 7B, and 7C are cross-sectional views sequentially illustrating a method of manufacturing an insulating line and a connecting line according to an embodiment.
Figure 7B:
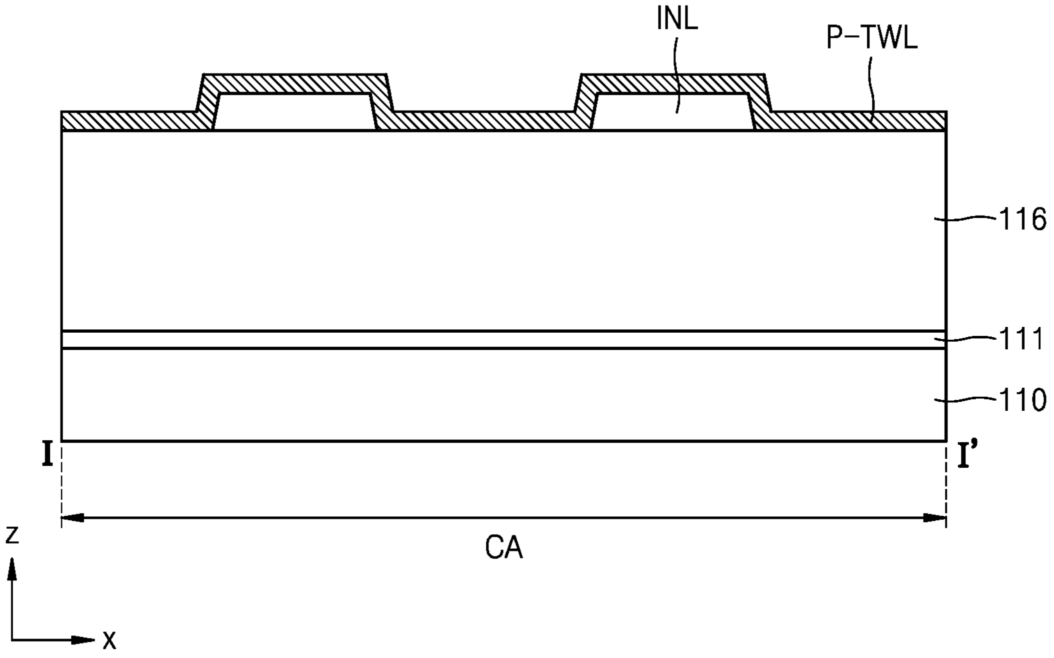
Figure 7C:
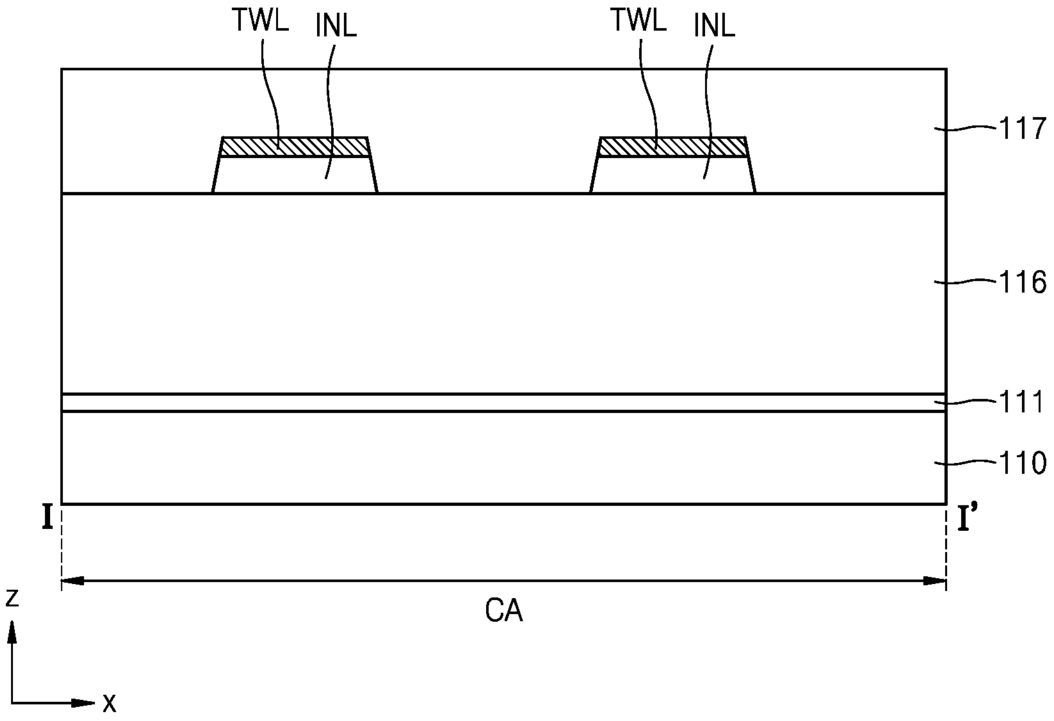

FIGS. 7A to 7C are cross-sectional views sequentially illustrating a method of manufacturing the insulating line INL and a transparent connecting line according to an embodiment.

Referring to FIG. 7A, the insulating line INL is disposed on the first organic insulating layer 116. First, an inorganic insulating layer is entirely deposited on the first organic insulating layer 116, and then a photoresist is formed through a mask process and then etched to form the insulating line INL. Here, the insulating line INL may be obtained through a dry etching.

Next, referring to FIG. 7B, a transparent conductive material layer P-TWL is deposited above the first organic insulating layer 116 to cover the insulating line INL. Next, a photoresist is formed through a mask process and etched to form the connecting line TWL. Here, the connecting line TWL may be obtained through a wet etching.

Next, as illustrated in FIG. 7C, the second organic insulating layer 117 is applied above the first organic insulating layer 116 so as to cover the insulating line INL and the connecting line TWL. In the manufacturing method according to the embodiment, the insulating line INL and the connecting line TWL are etched in different manners through separate photolithography processes, but one or more embodiments are not limited thereto. The insulating line INL and the connecting line TWL may be obtained by various methods, e.g., through one photo process.

Figure 8:
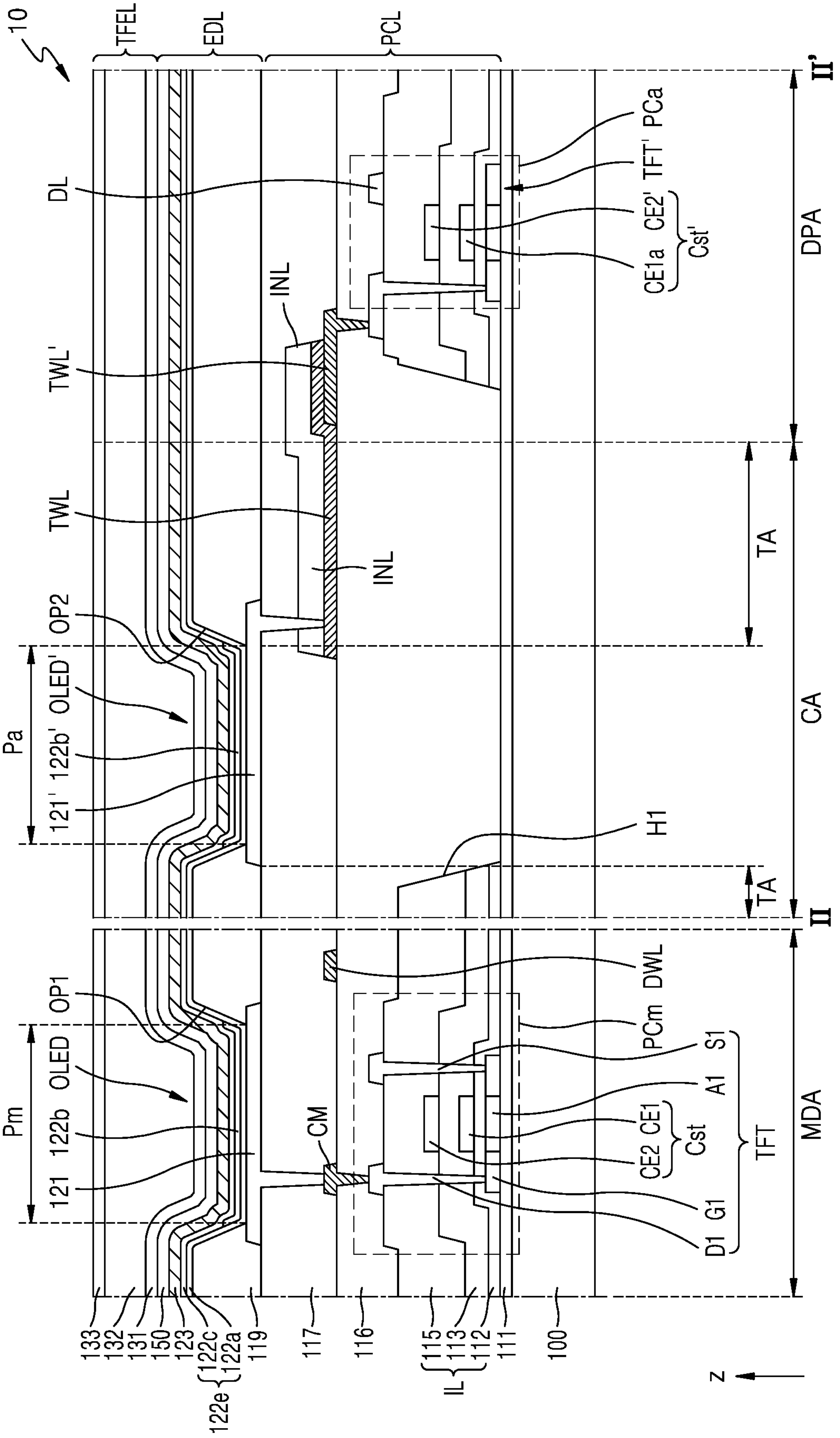
FIG. 8 is a cross-sectional view partially illustrating a display panel according to an embodiment.

FIG. 8 is a cross-sectional view partially illustrating the display panel 10 according to an embodiment. In FIG. 8, like reference numerals as those of FIG. 5 denote the same members, and detailed descriptions thereof are omitted.

Referring to FIG. 8, the auxiliary organic light-emitting diode OLED' is in the component area CA of the display panel 10 as an auxiliary display element, and the auxiliary pixel circuits PCa each including the auxiliary thin film transistor TFT' and the auxiliary storage capacitor Cst' may be in the peripheral area DPA. In addition, the connecting line TWL that connects the auxiliary pixel circuit PCa to the auxiliary organic light-emitting diode OLED' may be in the component area CA and the peripheral area DPA.

In the component area CA, a first organic insulating layer 116 and a second organic insulating layer 117 are stacked between the substrate 100 and the auxiliary organic light-emitting diode OLED', and the connecting line TWL may be between the first organic insulating layer 116 and the second organic insulating layer 117.

The insulating line INL patterned to correspond to the shape of the connecting line TWL may be partially in the component area CA. The insulating line INL may be in direct contact with the connecting line TWL and may be on and/or under the connecting line TWL.

In the embodiment, the insulating line INL may be between the connecting line TWL and the second organic insulating layer 117. The insulating line INL may be in direct contact with the connecting line TWL on the connecting line TWL.

In this case, a refractive index n' of the insulating line INL may have a value between the refractive index n0 of the connecting line TWL and the refractive index n2 of the second organic insulating layer 117. For example, the refractive index n' of the insulating line INL may be greater than the refractive index n2 of the second organic insulating layer 117 and may be less than the refractive index n0 of the connecting line TWL. (n0>n'>n2)

In some embodiments, the refractive index n0 of the connecting line TWL may be about 1.9 to about 2.1 with respect to a wavelength of 550 nm. The refractive index n' of the insulating line INL may be about 1.6 to about 1.8. The refractive index n2 of the second organic insulating layer 117 may be about 1.4 to about 1.6 with respect to the wavelength of 550 nm.

As a difference between the refractive index of the connecting line TWL and the refractive index of the insulating layers arranged under the connecting line TWL increases, a light diffraction intensity of the connecting line TWL may increase. In the embodiment, the insulating line INL having a material of a refractive index that is lower from that of the connecting line TWL is on the connecting line TWL, and thus, the light diffraction may be reduced. In addition, the insulating line INL is patterned to correspond to the connecting line TWL, and thus, the light transmittance of the component area CA may be increased.

In some embodiments, a light transmittance of the second organic insulating layer 117 may be greater than that of the first organic insulating layer 116. In some embodiments, a flatness of an upper surface of the second organic insulating layer 117 may be greater than that of an upper surface of the first organic insulating layer 116. That is, the upper surface of the second organic insulating layer 117 may be flatter than the upper surface of the first organic insulating layer 116. In some embodiments, the first organic insulating layer 116 may include photosensitive polyimide and the second organic insulating layer 117 may include a siloxane-based resin. In some embodiments, the insulating line INL may include silicon oxynitride (SiOxNy) (x>0, y>0), aluminum oxide ($Al_2O_3$), etc.

FIGS. 9A to 9D are cross-sectional views sequentially illustrating a method of manufacturing an insulating line and a connecting line according to the embodiment of FIG. 8, and illustrating a part of the component area CA.

Figure 9A:
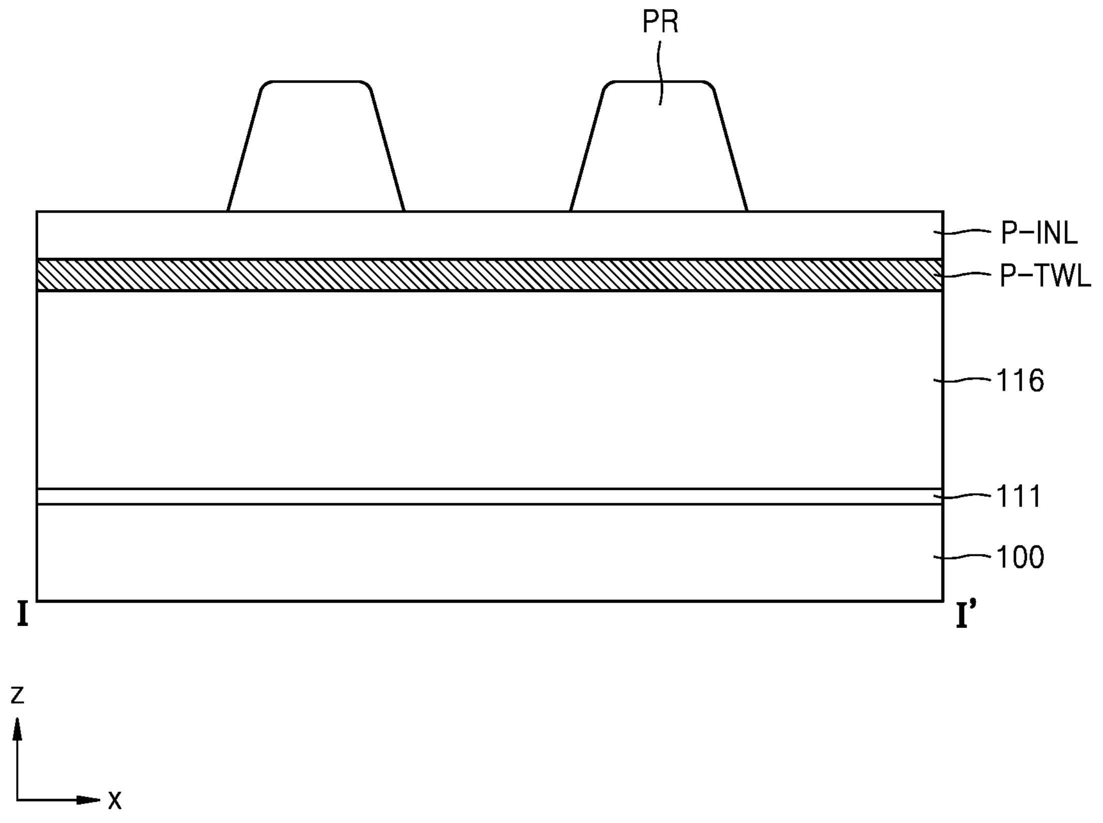
FIGS. 9A, 9B, 9C, and 9D are cross-sectional views sequentially illustrating a method of manufacturing an insulating line and a connecting line according to the embodiment of FIG. 8.

Referring to FIG. 9A, the transparent conductive material layer P-TWL and an inorganic insulating layer P-INL are sequentially deposited on the first organic insulating layer 116, and a photoresist pattern PR is formed through a mask process.

Figure 9B:
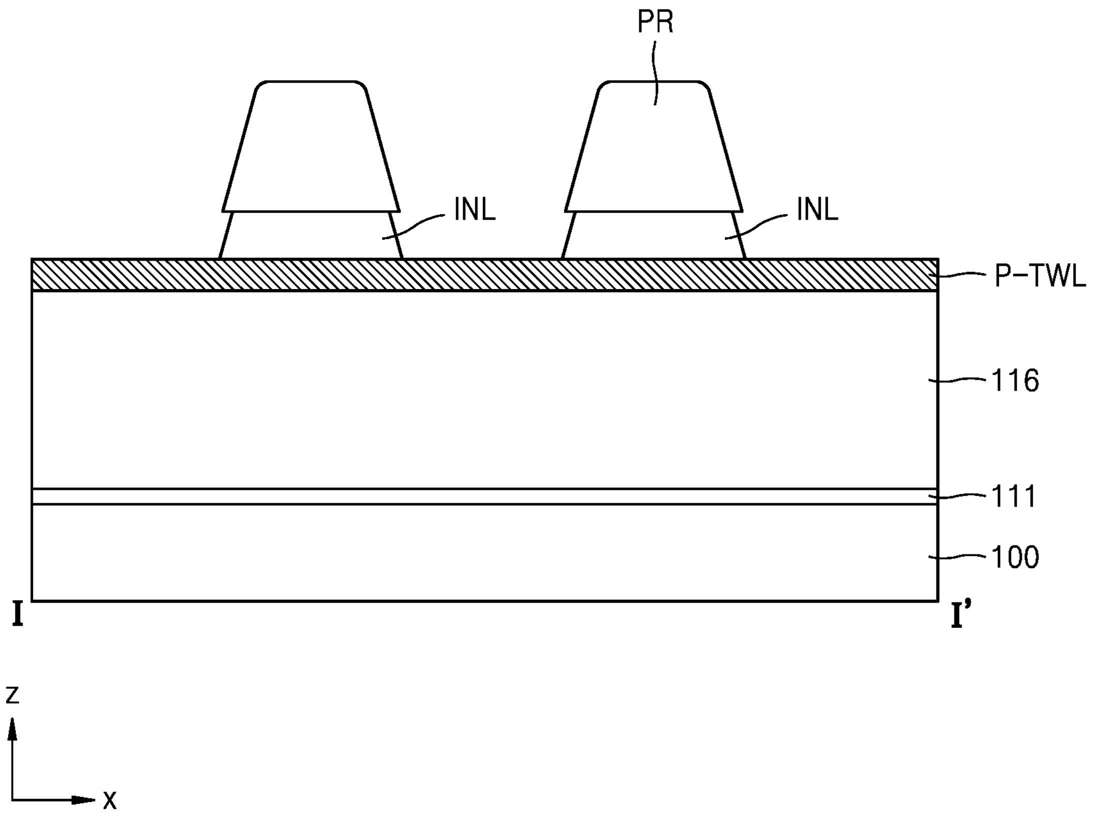

Referring to FIG. 9B, the inorganic insulating layer pINL is etched by using the photoresist pattern PR as a mask to form the insulating line INL. Here, the insulating line INL may be obtained through a dry etching.

Figure 9C:
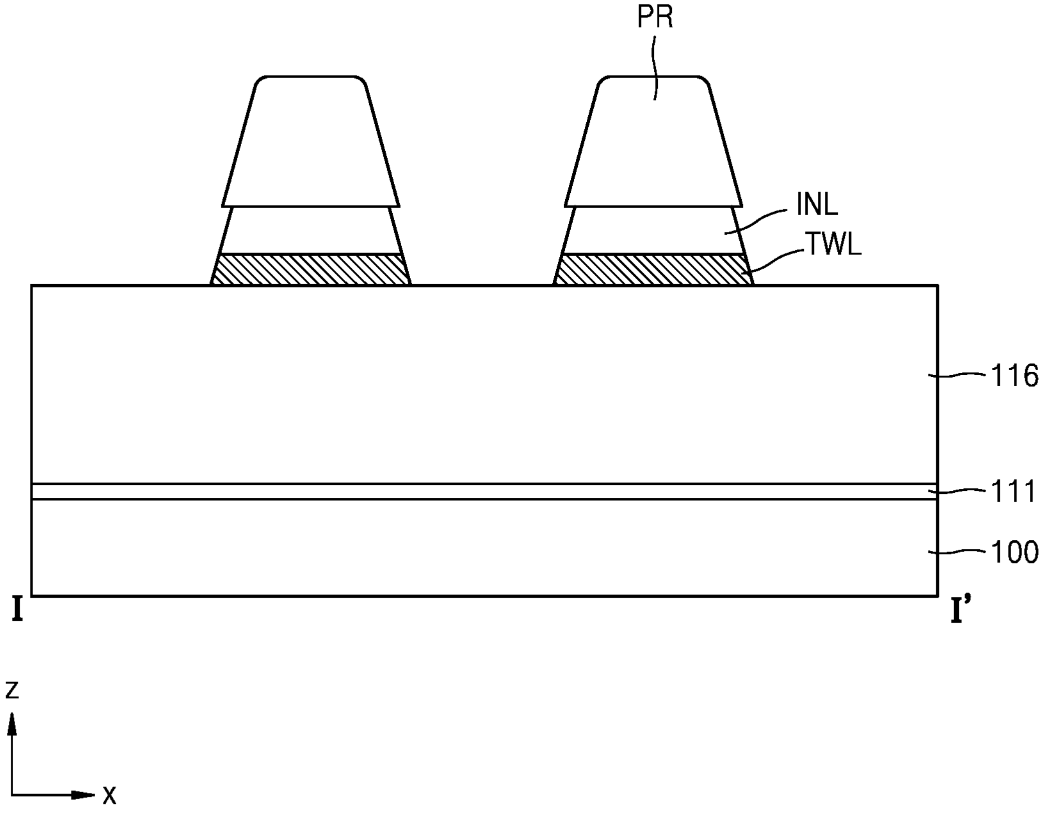

Next, as illustrated in FIG. 9C, by using the photoresist pattern PR used to form the insulating line INL as a mask, the transparent conductive material layer P-TWL is etched to form the connecting line TWL. Here, the connecting line TWL may be obtained through a wet etching.

Figure 9D:
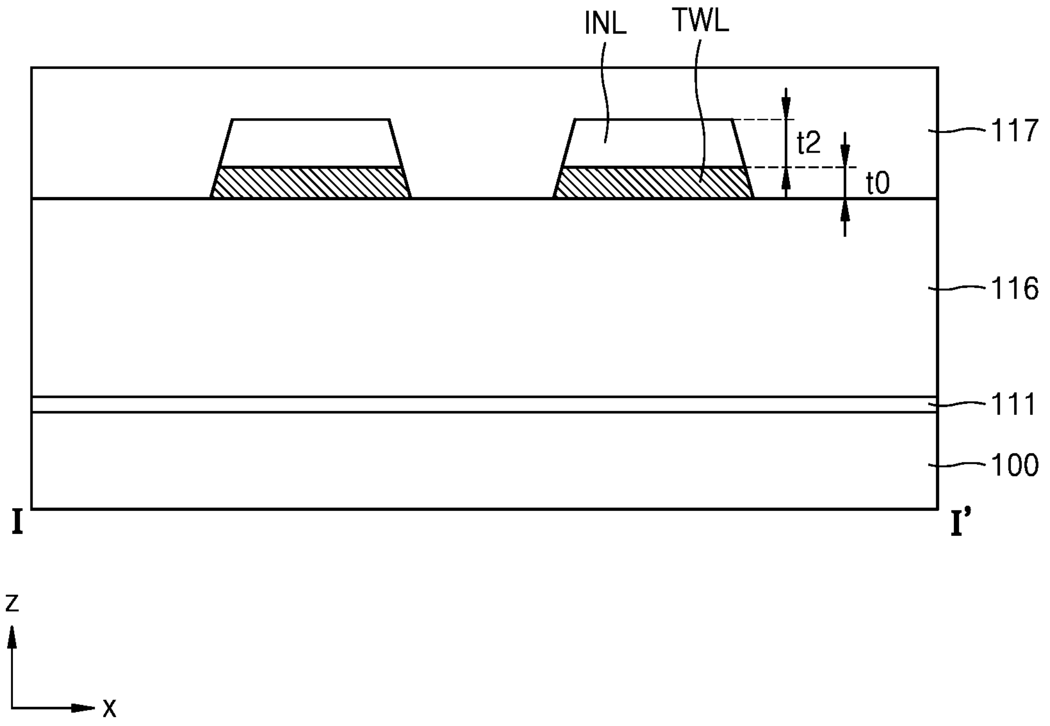

Next, referring to FIG. 9D, the photoresist pattern PR is removed, and the second organic insulating layer 117 is applied to cover the connecting line TWL and the insulating line INL on the first organic insulating layer 116.

As described above, when the insulating line INL is on the connecting line TWL, the insulating line INL and the connecting line TWL are etched by using the same photoresist PR, and thus, the insulating line INL may be obtained without additionally performing a mask process.

In addition, as in the embodiment, when the insulating line INL is on the connecting line TWL, the thickness t0 of the connecting line TWL may be less than the thickness t2 of the insulating line INL. For example, the thickness t0 of the connecting line TWL may be about 40 nm to about 60 nm, and the thickness t2 of the insulating line INL may be about 80 nm to about 120 nm. In the above range, the light transmittance is the largest and the reflectivity is the smallest in the component area CA.

Figure 10:
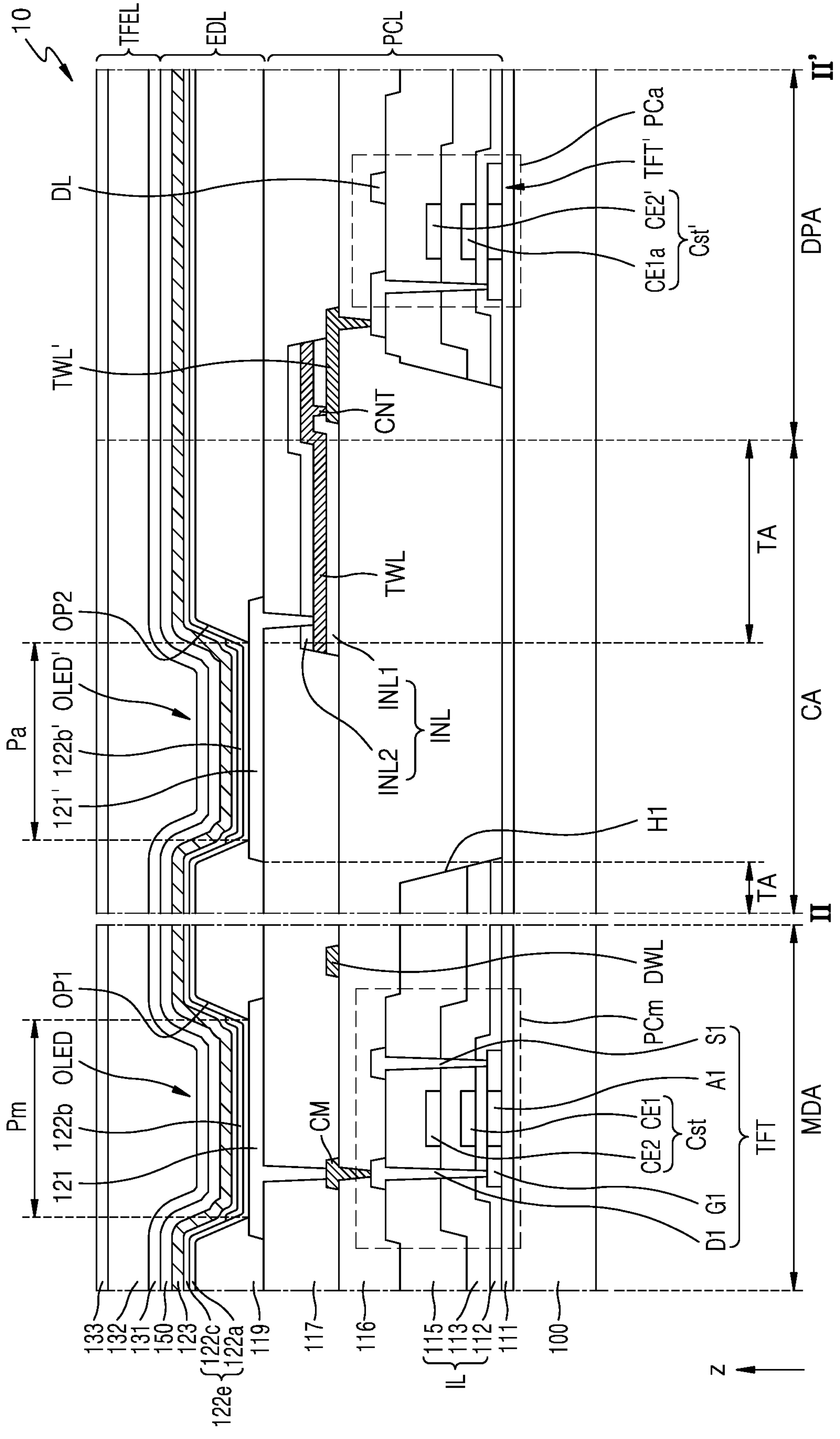
FIG. 10 is a cross-sectional view partially illustrating a display panel according to an embodiment.

FIG. 10 is a cross-sectional view partially illustrating the display panel 10 according to an embodiment. In FIG. 10, like reference numerals as those of FIG. 5 denote the same members, and detailed descriptions thereof are omitted.

Referring to FIG. 10, the auxiliary organic light-emitting diode OLED' is disposed in the component area CA of the display panel 10 as an auxiliary display element, and the auxiliary pixel circuits PCa each including the auxiliary thin film transistor TFT' and the auxiliary storage capacitor Cst' may be in the peripheral area DPA. In addition, the connecting line TWL to connect the auxiliary pixel circuit PCa to the auxiliary organic light-emitting diode OLED' may be in the component area CA and the peripheral area DPA.

In the component area CA, a first organic insulating layer 116 and a second organic insulating layer 117 are stacked between the substrate 100 and the auxiliary organic light-emitting diode OLED', and the connecting line TWL may be between the first organic insulating layer 116 and the second organic insulating layer 117.

The insulating line INL patterned to overlap the connecting line TWL may be in the component area CA. The insulating line INL may be in direct contact with the connecting line TWL and may be on and/or under the connecting line TWL.

In the embodiment, the insulating line INL may include a first insulating line INL1 and a second insulating line INL2. The first insulating line INL1 may be under the connecting line TWL and the second insulating line INL2 may be on the connecting line TWL.

The first insulating line INL1 may be between the first organic insulating layer 116 and the connecting line TWL, and the second insulating line INL2 may be between the connecting line TWL and the second organic insulating layer 117. The first insulating line INL1 and the second insulating line INL2 may be in direct contact with the connecting line TWL under and on the connecting line TWL.

A refractive index n1' of the first insulating line INL1 may have a value between a refractive index n1 of the first organic insulating layer 116 and a refractive index n0 of the connecting line TWL. A refractive index n2' of the second insulating line INL2 may have a value between the refractive index n0 of the connecting line TWL and the refractive index n2 of the second organic insulating layer 117. For example, the refractive indices n1' and n2' of the first insulating line INL1 and the second insulating line INL2 may be greater than the refractive index n1 of the first organic insulating layer 116 and the refractive index n2 of the second insulating line INL2, and may be less than the refractive index n0 of the connecting line TWL. (n0>n1', n2'>n1, n2)

In some embodiments, the refractive index n0 of the connecting line TWL may be about 1.9 to about 2.1 with respect to a wavelength of 550 nm. The refractive indices n1' and n2' of the first and second insulating lines INL1 and INL2 may be about 1.6 to about 1.8. The refractive index n1 of the first organic insulating layer 116 and the refractive index n2 of the second organic insulating layer 117 may be about 1.4 to about 1.6 with respect to the wavelength of 550 nm.

As a difference between the refractive index of the connecting line TWL and the refractive index of the insulating layers arranged under the connecting line TWL increases, a light diffraction intensity of the connecting line TWL may increase. In the embodiment, the insulating lines INL having a material of a refractive index that is lower from that of the connecting line TWL are disposed on and under the connecting line TWL, and thus, the light diffraction may be reduced. In addition, the insulating line INL is patterned to correspond to the connecting line TWL, and thus, the light transmittance of the component area CA may be increased.

In some embodiments, a light transmittance of the second organic insulating layer 117 may be greater than that of the first organic insulating layer 116. In some embodiments, a flatness of an upper surface of the second organic insulating layer 117 may be greater than that of an upper surface of the first organic insulating layer 116. That is, the upper surface of the second organic insulating layer 117 may be flatter than the upper surface of the first organic insulating layer 116. In some embodiments, the first organic insulating layer 116 may include photosensitive polyimide and the second organic insulating layer 117 may include a siloxane-based resin. In some embodiments, the insulating line INL may include silicon oxynitride (SiOxNy) (x>0, y>0), aluminum oxide ($Al_2O_3$), etc.

FIGS. 11A to 11D are cross-sectional views sequentially illustrating a method of manufacturing an insulating line and a connecting line according to the embodiment of FIG. 10, and illustrating a part of the component area CA.

Figure 11A:
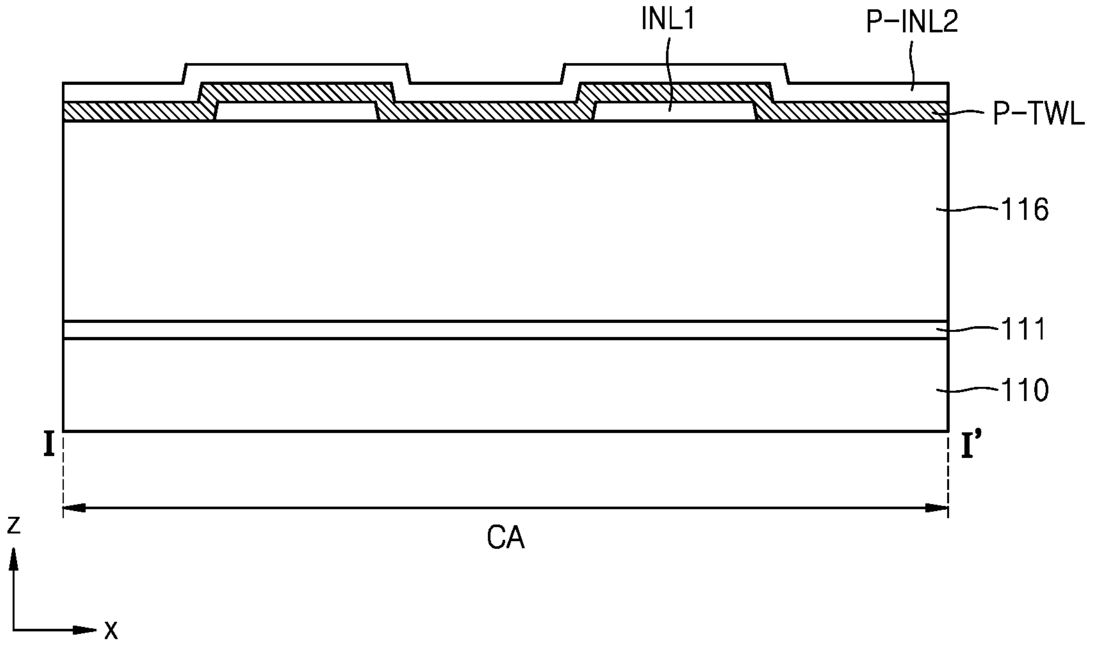
FIGS. 11A, 11B, and 11C are cross-sectional views sequentially illustrating a method of manufacturing an insulating line and a connecting line according to the embodiment of FIG. 10.

Referring to FIG. 11A, the first insulating line INL1 is on the first organic insulating layer 116. In order to form the first insulating line INL1, a photoresist is formed through a first mask process and is etched to form the first insulating line INL1. Here, the first insulating line INL1 may be obtained through a dry etching.

Next, the transparent conductive material layer P-TWL and the inorganic insulating layer pINL are deposited on an entire surface of the substrate 100 so as to cover the first insulating line INL1.

Figure 11B:
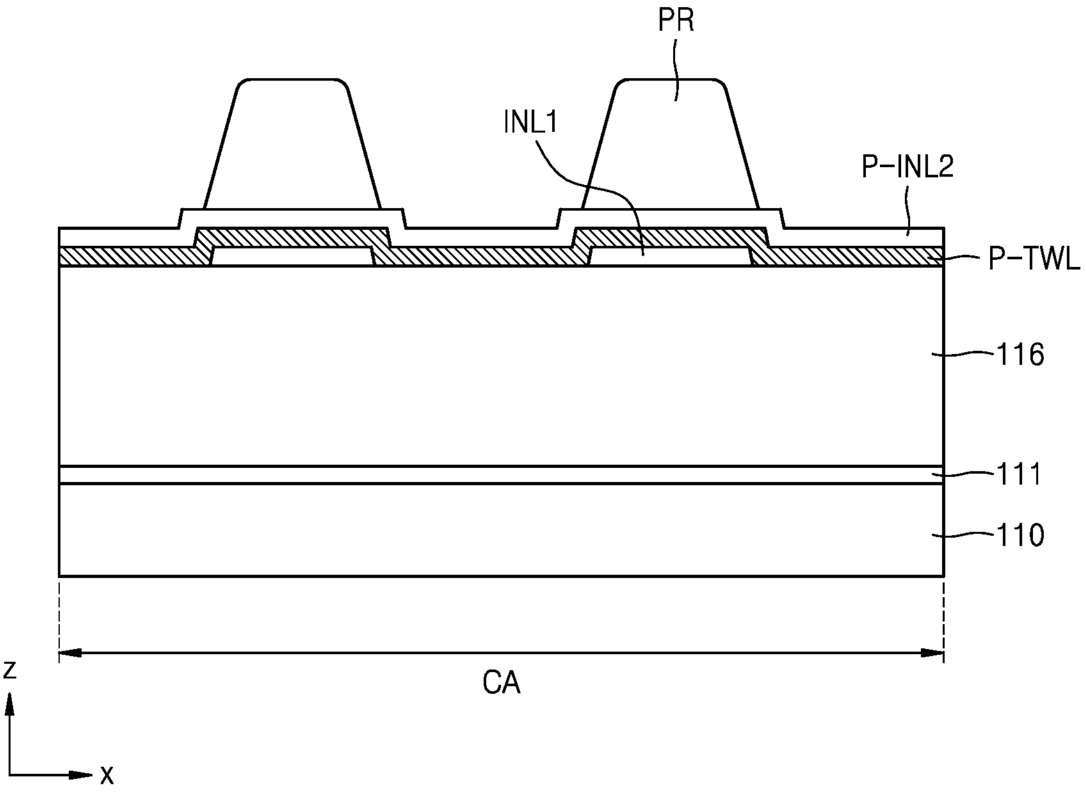

Next, as illustrated in FIG. 11B, a photoresist pattern PR is formed on the inorganic insulating layer pINL through a second mask process. Next, the second insulating line INL2 is obtained by etching the inorganic insulating layer pINL by using the photoresist pattern PR as a mask. Here, the second insulating line INL2 may be obtained through a dry etching.

Next, the transparent conductive material layer P-TWL is etched by using the photoresist pattern PR as a mask to form the connecting line TWL. Here, the connecting line TWL may be obtained through a wet etching.

Figure 11C:
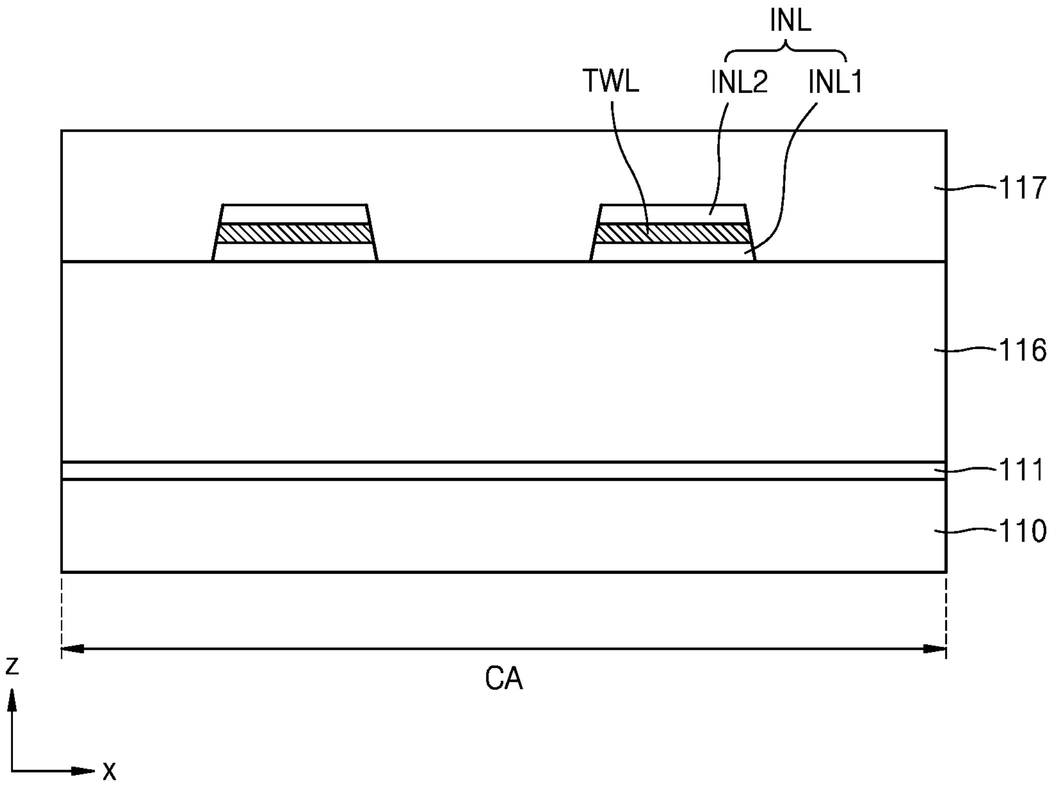

Next, referring to FIG. 11C, the photoresist pattern PR is removed, and the second organic insulating layer 117 is applied to cover the first insulating line INL1, the connecting line TWL, and the second insulating line INL2 on the first organic insulating layer 116.

In FIG. 11C, thicknesses of the first insulating line INL1, the connecting line TWL, and the second insulating line INL2 are illustrated to be equal to one another, but one or more embodiments are not limited thereto.

Figure 12A:
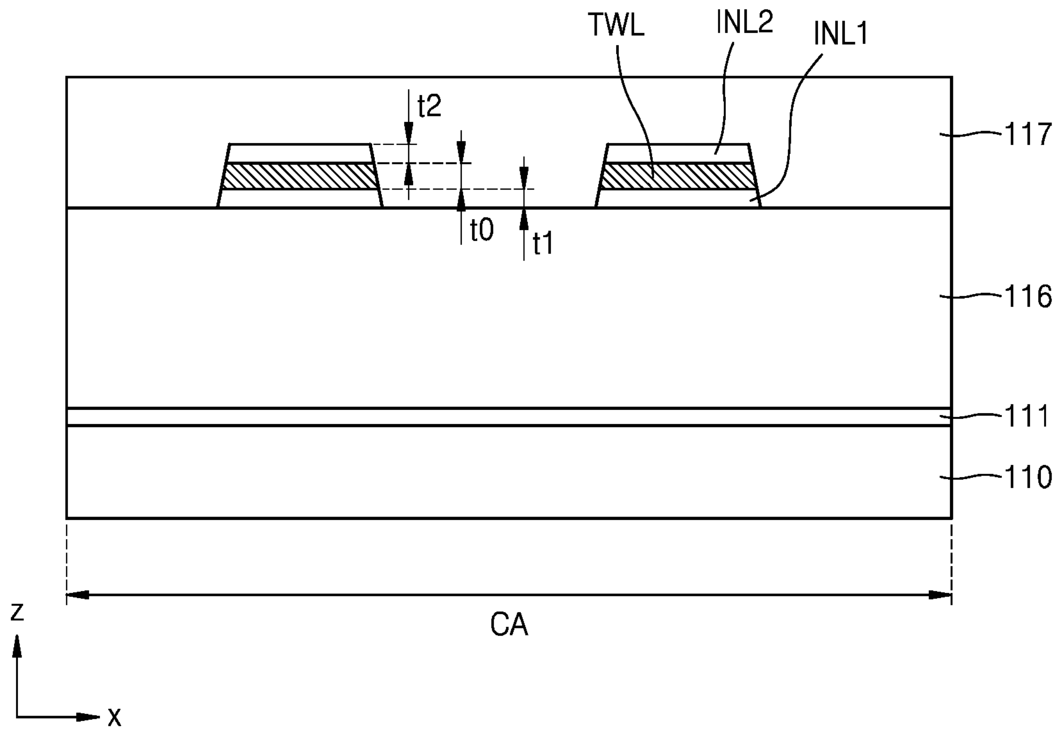
FIGS. 12A and 12B are cross-sectional views illustrating a region of a display panel according to one or more embodiments.
Figure 12B:
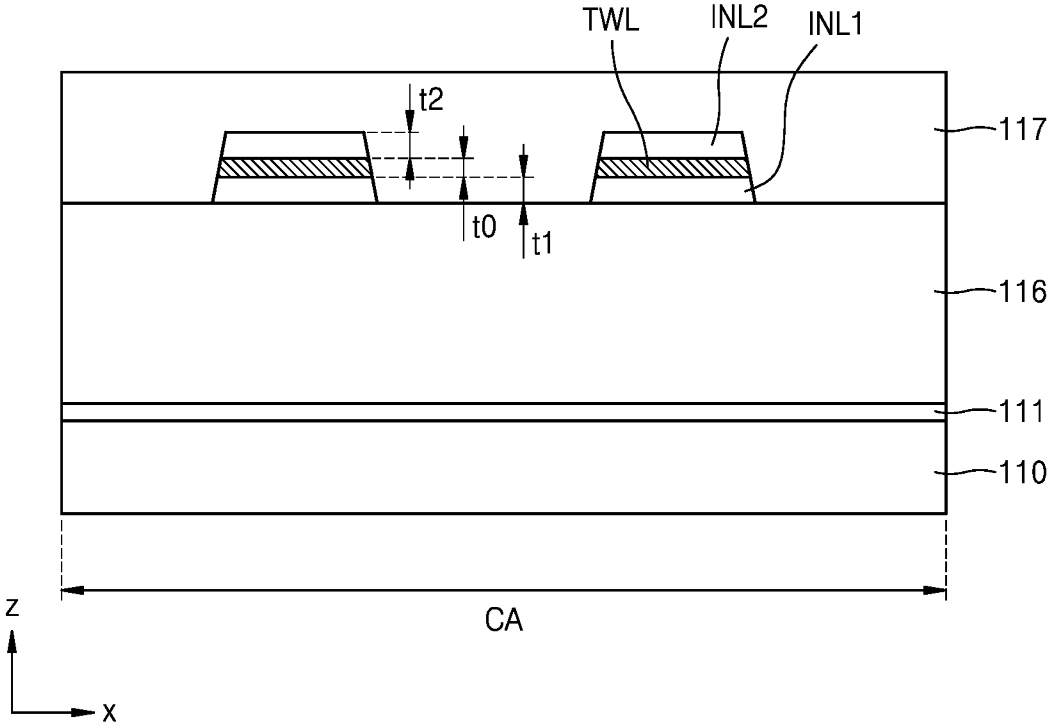

FIGS. 12A and 12B are cross-sectional views illustrating a region of a display panel according to one or more embodiments.

Referring to FIG. 12A, when the first insulating line INL1 and the second insulating line INL2 are under and on the connecting line TWL, the thickness t0 of the connecting line TWL may be less than those of the first insulating line INL1 and the second insulating line INL2. For example, the thickness t0 of the connecting line TWL may be about 40 nm to about 60 nm, and the thickness t1 of the first insulating line INL1 and the thickness t2 of the second insulating line INL2 may be about 80 nm to about 120 nm. In the above range, the light transmittance is the largest and the reflectivity is the smallest in the component area CA.

Referring to FIG. 12B, when the first insulating line INL1 and the second insulating line INL2 are under and on the connecting line TWL, the thickness t0 of the connecting line TWL may be greater than those of the first insulating line INL1 and the second insulating line INL2. For example, the thickness t0 of the connecting line TWL may be about 80 nm to about 120 nm, and the thickness t1 of the first insulating line INL1 and the thickness t2 of the second insulating line INL2 may be about 70 nm to about 90 nm. In the above range, the light transmittance is the largest and the reflectivity is the smallest in the component area CA.

Figure 13:
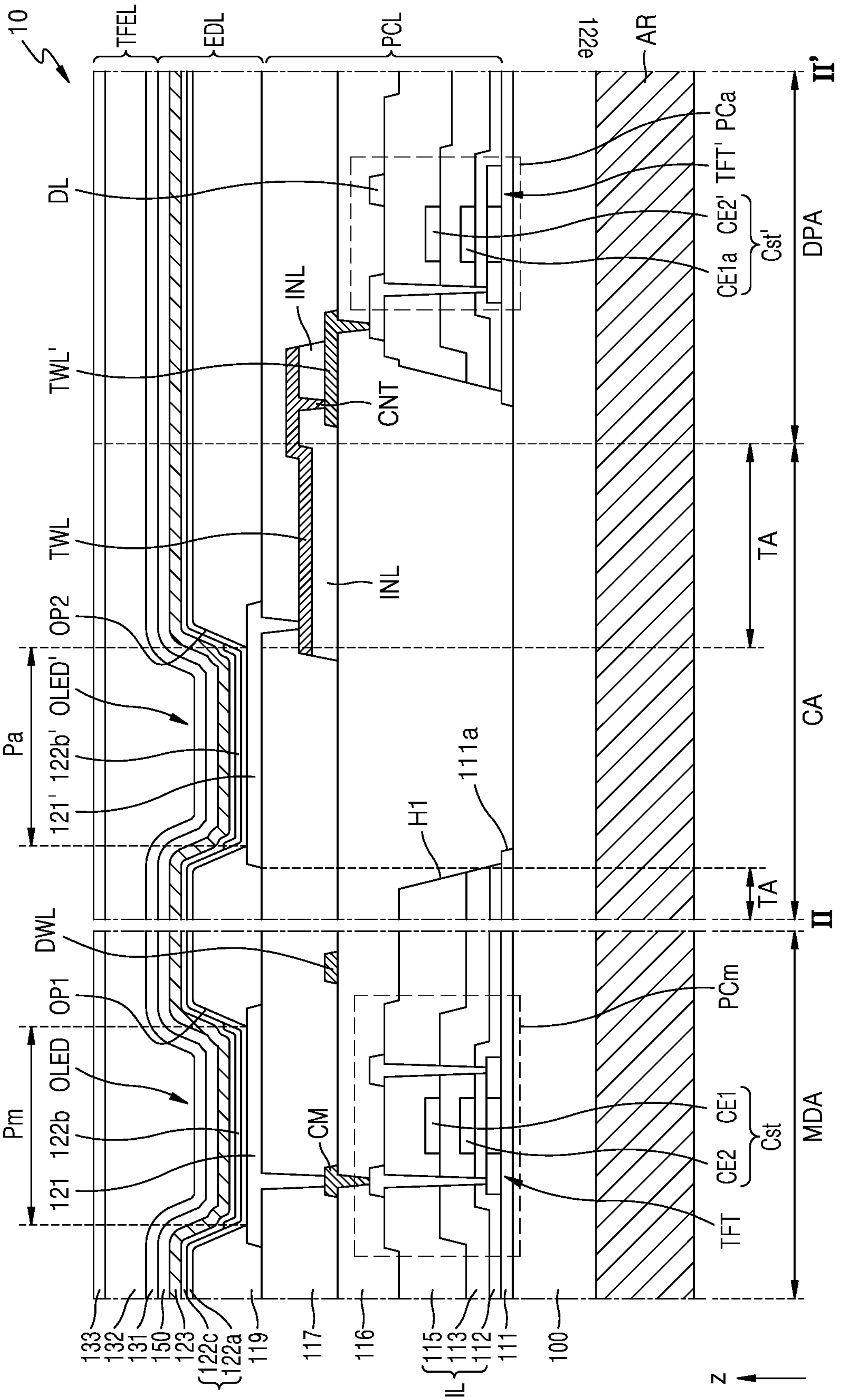
FIG. 13 is a cross-sectional view partially illustrating a display panel according to an embodiment.

FIG. 13 is a cross-sectional view partially illustrating the display panel 10 according to an embodiment. In FIG. 13, like reference numerals as those of FIG. 5 denote the same members, and detailed descriptions thereof are omitted.

Referring to FIG. 13, the auxiliary organic light-emitting diode OLED' is in the component area CA of the display panel 10 as an auxiliary display element, and the auxiliary pixel circuits PCa each including the auxiliary thin film transistor TFT' and the auxiliary storage capacitor Cst' may be in the peripheral area DPA. In addition, the connecting line TWL configured to connect the auxiliary pixel circuit PCa to the auxiliary organic light-emitting diode OLED' may be in the component area CA and the peripheral area DPA.

In the component area CA, a first organic insulating layer 116 and a second organic insulating layer 117 are stacked between the substrate 100 and the auxiliary organic light-emitting diode OLED', and the connecting line TWL may be between the first organic insulating layer 116 and the second organic insulating layer 117.

In the embodiment, the insulating line INL patterned to overlap the connecting line TWL may be in the component area CA. The insulating line INL may be in direct contact with the connecting line TWL and may be on and/or under the connecting line TWL.

In the embodiment, the buffer layer 111 may include an opening 111*a* corresponding to the component area CA. When the buffer layer 111 includes the opening 111*a*, the light transmittance of the component area CA may be improved.

Also, in the embodiment, an anti-reflection film AR may be under the substrate 100. The anti-reflection film AR may be attached to the lower portion of the substrate 100 via an adhesive layer.

The anti-reflection film AR may include a light-transmitting base material, a hard coating layer, and a low-refractive index layer. The low refractive index layer may have a refractive index of about 1.2 to about 1.4 within a wavelength range of 550 nm. As the anti-reflection film AR is provided, the light reflection that may occur on the lower interface of the substrate 100 may be reduced, and the light transmittance of the component area CA may be improved.

Figure 14A:
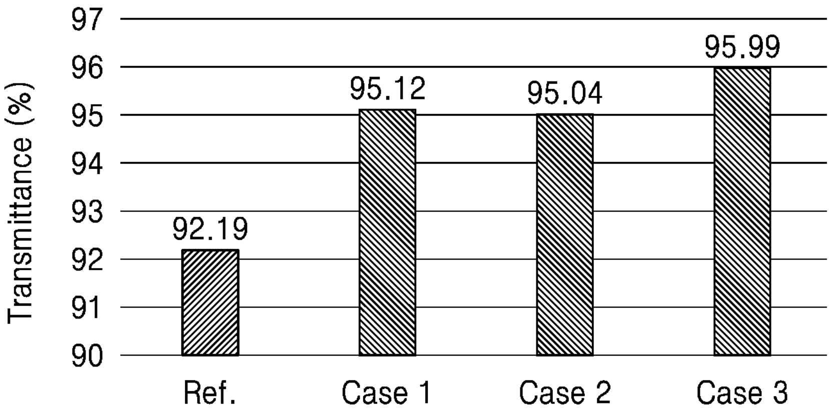
FIGS. 14A and 14B illustrate data of simulating a light transmittance and a light reflectivity according to a stack structure in the component area according to one or more embodiments.
Figure 14B:
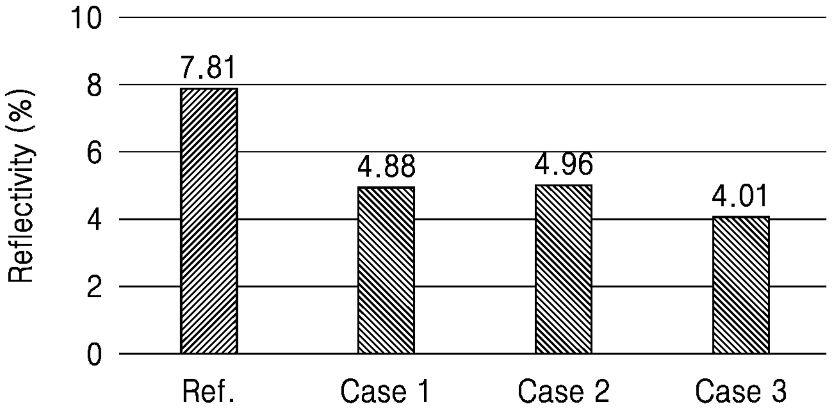

FIGS. 14A and 14B illustrate data of simulating a light transmittance and a light reflectivity according to a stack structure in the component area CA according to one or more embodiments. Here, the refractive index of the substrate is set to be 1.5, the refractive index of the first organic insulating layer and the second organic insulating layer is set to be 1.5, the refractive index of the connecting line is set to be 1.9, and the refractive index of the insulating line is set to be 1.7.

A comparative example (Ref) illustrates an example, in which the substrate/first organic insulating layer/connecting line/second organic insulating layer are sequentially stacked and a thickness of the connecting line is 50 nm. In the comparative example (Ref.), the light transmittance is 92.19% and the reflectivity is 7.81%.

Case 1 illustrates an example, in which the substrate/first organic insulating layer/insulating line/connecting line/the second organic insulating layer are sequentially stacked, a thickness of the insulating line is 100 nm, and the thickness of the transparent connecting line is 50 nm. In Case 1, the light transmittance was 95.12% and the reflectivity was 4.88%.

Case 2 illustrates an example, in which the substrate/first organic insulating layer/connecting line/insulating line/second organic insulating layer are sequentially stacked, the thickness of the insulating line is 100 nm, and the thickness of the connecting line is 50 nm. In Case 2, the light transmittance was 95.04% and the reflectivity was 4.96%.

Case 3 illustrates an example, in which the substrate/first organic insulating layer/first insulating line/connecting line/second insulating line/second organic insulating layer are sequentially stacked, the thickness of the first and second insulating lines is 80 nm, and the thickness of the connecting line is 50 nm. In Case 3, the light transmittance was 95.99% and the reflectivity was 4.01%.

As illustrated in the data, when the insulating line is provided, the light transmittance increases and the reflectivity decreases. In addition, when the insulating lines are provided on and under the connecting line as illustrated in Case 3, the largest light transmittance and the smallest reflectivity are illustrated.

As described above, the display panel and the display apparatus according to one or more embodiments, the pixel circuits are not in the component area, and thus, a relatively wider transmission region may be ensured to thereby improving transmittance.

Also, the insulating line overlapping the connecting line is on and/or under the connecting line in the component area, and thus, the light diffraction effect caused by the refractive index difference may be reduced.

However, the scope of one or more embodiments is not limited to the above effects.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel comprising:

a substrate including a main display area, a component area, and a peripheral area;

an auxiliary display element in the component area, the auxiliary display element includes a light producing emission layer disposed between an pixel electrode and an opposite electrode;

an auxiliary pixel circuit in the peripheral area, the auxiliary pixel circuit drives the auxiliary display element to emit light, the auxiliary pixel circuit including an auxiliary thin film transistor and an auxiliary storage capacitor;

a connecting line connecting the auxiliary display element to the auxiliary pixel circuit, the connecting line having at least a part in the component area;

an insulating line overlapping the connecting line in the component area; and a first organic insulating layer and a second organic insulating layer stacked between the substrate and the auxiliary display element in the component area; and a pixel defining layer disposed on the second organic insulating layer and on the pixel electrode, the emission layer and the opposite electrode are disposed on the pixel defining layer, wherein the connecting line and the insulating line are disposed between the first organic insulating layer and the second organic insulating layer.

2. The display panel of claim 1, wherein a refractive index of the insulating line has a value between a refractive index of the first organic insulating layer and a refractive index of the connecting line.

3. The display panel of claim 2, wherein the connecting line electrically connects the auxiliary display element to the auxiliary pixel circuit, and the connecting line is comprised of a transparent conductive material selected from indium tin oxide (ITO), indium zinc oxide (IZO), zinc oxide (ZnO), indium oxide ($In_2O_3$), indium gallium oxide, and aluminum zinc oxide (AZO).

4. The display panel of claim 2, wherein the insulating line is comprised of an inorganic insulating material, and the insulating line is disposed directly on the first organic insulating layer.

5. The display panel of claim 1, wherein the insulating line is under the connecting line.

6. The display panel of claim 5, wherein a thickness of the insulating line is greater than a thickness of the connecting line.

7. The display panel of claim 5, wherein a width of an upper surface of the insulating line is different from a width of a lower surface of the connecting line.

8. The display panel of claim 1, wherein the insulating line is on the connecting line.

9. The display panel of claim 8, wherein a thickness of the insulating line is greater than a thickness of the connecting line.

10. The display panel of claim 1, wherein the insulating line includes a first insulating line and a second insulating line, and the first insulating line is under the connecting line and the second insulating line is on the connecting line.

11. The display panel of claim 10, wherein a refractive index of the first insulating line has a value between a refractive index of the first organic insulating layer and a refractive index of the connecting line, and a refractive index of the second insulating line has a value between a refractive index of the second organic insulating layer and the refractive index of the connecting line.

12. The display panel of claim 10, wherein a thickness of the first insulating line and a thickness of the second insulating line are less than a thickness of the connecting line.

13. The display panel of claim 10, wherein a thickness of the first insulating line and a thickness of the second insulating line are greater than a thickness of the connecting line.

14. The display panel of claim 1, wherein the first organic insulating layer includes photosensitive polyimide and the second organic insulating layer includes a siloxane-based resin.

15. The display panel of claim 1, further comprising:

a metal connecting line connecting the connecting line to the auxiliary display element, wherein the metal connecting line is at a same layer as the connecting line and an end of the connecting line is in direct contact with the metal connecting line.

16. The display panel of claim 1, further comprising:

an inorganic insulating layer on the substrate, wherein the inorganic insulating layer includes a hole or a groove corresponding to the component area.

17. The display panel of claim 16, wherein the first organic insulating layer fills the hole or the groove of the inorganic insulating layer and is on a front surface of the substrate.

18. The display panel of claim 1, further comprising:

a buffer layer between the substrate and the auxiliary thin film transistor, wherein the buffer layer includes an opening corresponding to the component area.

19. The display panel of claim 1, further comprising:

an anti-reflection layer on a lower surface of the substrate.

20. The display panel of claim 1, wherein the insulating line is patterned to correspond to the connecting line, and a center line of the connecting line extending in a longitudinal direction of the connecting line from the auxiliary pixel circuit to the auxiliary display element and a center line of the insulating line coincide in a plan view.

21. The display panel of claim 1, wherein the first organic insulating layer and the second organic insulating layer are disposed between the substrate and the pixel electrode in a thickness direction of the display panel, and the pixel electrode being planarized on the second organic insulating layer due to the second organic insulating layer having a flat upper surface.

22. A display apparatus comprising:

a display panel including a main display area including main sub-pixels, a component area including auxiliary sub-pixels, and a peripheral area; and a component under the display panel to correspond to the component area, wherein the display panel comprises:

a substrate;

an auxiliary display element in the component area, the auxiliary display element includes a light producing emission layer disposed between an pixel electrode and an opposite electrode;

an auxiliary pixel circuit in the peripheral area, the auxiliary pixel circuit including an auxiliary thin film transistor and an auxiliary storage capacitor;

a connecting line connecting the auxiliary display element to the auxiliary pixel circuit, the connecting line having at least a part in the component area;

an insulating line overlapping the connecting line in the component area; and a first organic insulating layer and a second organic insulating layer stacked between the substrate and the auxiliary display element in the component area; and a pixel defining layer disposed on the second organic insulating layer and on the pixel electrode, the emission layer and the opposite electrode are disposed on the pixel defining layer, wherein the connecting line and the insulating line are between the first organic insulating layer and the second organic insulating layer.

23. The display apparatus of claim 22, wherein a refractive index of the insulating line has a value between a refractive index of the first organic insulating layer and a refractive index of the connecting line.

24. The display apparatus of claim 22, wherein the insulating line includes a first insulating line and a second insulating line, and the first insulating line is under the connecting line and the second insulating line is on the connecting line.

25. The display apparatus of claim 24, wherein a refractive index of the first insulating line has a value between a refractive index of the first organic insulating layer and a refractive index of the connecting line, and a refractive index of the second insulating line has a value between a refractive index of the second organic insulating layer and the refractive index of the connecting line.

26. The display apparatus of claim 22, wherein the first organic insulating layer includes photosensitive polyimide and the second organic insulating layer includes a siloxane-based resin.

27. The display apparatus of claim 22, further comprising:

an inorganic insulating layer on the substrate, wherein the inorganic insulating layer includes a hole or a groove corresponding to the component area.

28. The display apparatus of claim 27, wherein the first organic insulating layer fills the hole or the groove of the inorganic insulating layer and is on a front surface of the substrate.

29. The display apparatus of claim 22, wherein the component includes an imaging device.

* * * * *